United States Patent [19]
Kimura et al.

[11] Patent Number: 5,270,232
[45] Date of Patent: Dec. 14, 1993

[54] PROCESS FOR FABRICATING FIELD EFFECT TRANSISTOR

[75] Inventors: Shinichiro Kimura, Kunitachi; Shoji Shukuri, Koganei; Hiromasa Noda, Suginami; Digh Hisamoto, Kokubunji; Hideyuki Matsuoka; Kazuyoshi Torii, both of Kodaira; Natsuki Yokoyama, Mitaka; Toshiyuki Yoshimura, Kokubunji; Kazunori Tsujimoto, Higashiyamato; Eiji Takeda, Koganei, all of Japan

[73] Assignee: Hitachi, Ltd., Tokyo, Japan

[21] Appl. No.: 943,018

[22] Filed: Sep. 10, 1992

[30] Foreign Application Priority Data

Sep. 13, 1991 [JP] Japan .................. 3-234426

[51] Int. Cl.⁵ .......................... H01L 21/70
[52] U.S. Cl. ........................ 437/41; 437/40; 437/44; 437/162
[58] Field of Search .......... 437/29, 40, 41, 44, 437/160, 162

[56] References Cited

U.S. PATENT DOCUMENTS

| | | | |
|---|---|---|---|
| 4,419,810 | 12/1983 | Riseman | 437/162 |
| 4,845,046 | 7/1989 | Shimbo | 437/162 |
| 4,939,154 | 7/1990 | Shimbo | 437/162 |
| 4,978,629 | 12/1990 | Komori et al. | 437/41 |
| 5,008,209 | 4/1991 | Appels et al. | 437/162 |
| 5,175,118 | 12/1992 | Yoneda | 437/162 |

FOREIGN PATENT DOCUMENTS

| | | |
|---|---|---|
| 124874 | 7/1985 | Japan . |
| 35570 | 2/1987 | Japan . |
| 129928 | 5/1990 | Japan . |

Primary Examiner—Tom Thomas
Attorney, Agent, or Firm—Antonelli, Terry, Stout & Kraus

[57] ABSTRACT

A very thin oxide film is formed at an opening formed in an insulator film and a conductor layer, on a substrate, and impurity-containing polysilicon is formed on the sidewall of the opening. Impurity diffusion from the from the silicon into the substrate through the very thin oxide film causes a lowering in effective concentration of the diffused impurities, resulting in the formation of shallower source/drain region. Thereafter, a gate insulator film and a gate electrode are formed on the substrate surface in an area bounded by an insulator film formed on the sidewall of the opening. The gate electrode smaller than the opening, the size of which corresponds to the limit of processing, and the shallower source/drain region afford a miniaturized MOSFET.

6 Claims, 32 Drawing Sheets

PROCESS FOR FABRICATING FIELD EFFECT TRANSISTOR

BACKGROUND OF THE INVENTION

Miniaturization of MOSFETs, which constitute the basis of silicon LSIs (Large Scale Integrated circuits), has been achieved heretofore along the fundamental concept of "Scaling Rule". For instance, 1-megabit chips of DRAM (Dynamic Random Access Memory), representative of the LSIs at present, are fabricated by use of FETs with a gate length of 1 μm, whereas a gate length of 0.8 μm is adopted for 4-megabit chips of DRAM, for which systems for mass production have been being put into order. It is certain that the size of semiconductor devices will be reduced further in company with the progress of miniaturization techniques.

The miniaturization of MOSFETs has been achieved not only by size reductions but by effective suppression of the punch-through phenomena which becomes stronger as size reduction proceeds. The achievement has been made with the aforementioned scaling rule as a guideline. According to the guiding principle, a reduction in size has been accomapnied by an increased substrate concentration, a thinner gate oxide film, and a shallower junction in source/drain regions. The principle should be maintained in making a further miniaturization of FETs. It is also true, however, that a variety of retardation factors in miniaturization have become clear. For example, the limit of thinning a gate oxide film is said to be 4 nm, because of the tunneling phenomea brought about directly by the thinning. Also, making a shallower junction is dependent on the diffusion of impurities, and it is impossible to achieve a junction depth of 0.05 μm or below. In order to realize a shorter channel, therefore, substrate concentration must be increased. The increase of substrate concentration causes a threshould voltage rise, leading to worse performance such as increased junction capacitance and lowered junction breakdown voltage. For solving the problems, FET structures as shown in FIGS. 3 to 5 have been proposed. A characteristic feature common to these structures is the so-called elevated structure in which source/drain regions are raised above the substrate surface. Another common feature is that gate length is determined self-alignedly by the space defined by the elevated junctions. Therefore, with the lithography technique on the order of 0.5 μm used for the recently started mass production of 16-megabit DRAMs, it is comparatively easy to realize a gate length of 0.3 μm or below, though depending on the thickness of oxide film formed on the sidewall. Besides, because impurities for suppression of FET punch-through can be implanted through the space between the adjacent elevated junctions, excessive rise in substrate concentration is obviated. Accordingly, the increase in junction capacitance is smaller, as compared to the cases of FETs of conventional structures.

Respective features of the FET structures mentioned above will now be described briefly, with reference to the drawings. Referring to FIG. 3, there is shown a structure disclosed in Japanese Patent Laid-Open No. 62-35570. The structure is characterized in that the area of junction 11 in the source/drain region is determined self-alignedly. To achieve this, a process is adopted in which the formation of field isolation oxide 2 on a substrate 1 is followed by formation of a dummy gate (not shown), self-aligned formation of an oxide film on the sidewall of the dummy gate, and selective oxidation with the sidewall film as a mask to re-oxidize the substrate. As a result of the oxidation, an oxide film 30 which determines the source/drain regions is grown on the substrate, in addition to the field isolation oxide 2. Thus the area of the source/drain region can be reduced. However, the gate length is determined by the width of the dummy gate, so that the feature of self-aligned determination of gate length is lost. In FIG. 3, numeral 1 denotes a semiconductor substrate, 2 field isolation oxide, 4 an elevated junction, 5 an oxide film, 11 a junction in the substrate, 12 an oxide film covering the sidewall of the elevated junction, 13 a gate oxide film, 14 a gate electrode, and 30 and 31 each denote an oxide film.

FIG. 4 shows a structure disclosed in Japanese Patent Laid-Open No. 60-124874. The structure is characterized in that junction is formed by impurity diffusion from an oxide film. For this purpose, a composite film consisting of an oxide film 32 which contains impurities, an oxid film 5 which does not contain impurities, and polysilicon 4 is first deposited on a substrate. Next, a region for gate formation is opened, and a polysilicon film 8 is formed on the sidewall of the elevated junction. The polysilicon-coated sidewall is covered further with an oxide film, for insulation between the elevated junction and the gate electrode 14. In this case the oxide film is a two stories film, with impurities contained in the lower oxide 32 and diffused therefrom to form a portion of junction 11 in the substrate. This structure, unlike the structure of FIG. 3, eliminates the need for impurities to be diffused under the sidewall oxide film 12 from the elevated polysilicon, and can yield a comparatively shallow junction. However, the impurity diffusion from the oxide film is almost impossible unless a considerably large amount of impurities are contained in the oxide film. Moreover, where impurites are introduced into the oxide film by ion implantation or the like, the impurities rarely diffuse. In the figure, numeral I denotes a semiconductor substrate, 4 polysilicon, 5 an oxide film, 8 sidewall polysilicon, 12 a sidewall oxide film, 13 a gate oxide film, 14 a gate electrode, 15 an oxide film, 17 wiring, and 32 denotes an oxide film which contains impurities.

FIG. 5 shows a structure disclosed in Japanese Patent Laid-Open No. 2-129928, in which controlled diffusion of impurities at source/drain edges is mentioned as one of the characteristic features of the structure. To achieve this, elevated polysilicon 4 is deposited on a substrate 1 provided with field isolation oxide 2, and the polysilicon 4 is processed into shape and then coated with an oxide film (not shown). Subsequently, a photoresist is deposited so as to fill a gate-forming region, while leaving exposed the oxide film covering the sidewall of the polysilicon 4, and the sidewall oxide film is removed. As a result, a gap corresponding to the thickness of the oxide film is produced between the photoresist filling the gate region and the elevated polysilicon 4. Impurites are implanted through the gap, whereby junction can be formed. According to this process, impurity distribution at source/drain edges can be controlled. The process, however, requires complicated procedures such as filling the gate region with photoresist. According to the structure and fabrication process, in addition, it is difficult to produce FETs with different gate lengths, because of the need for filling the gate region. In the figure, numeral 1 denotes a semiconductor substrate, 2 field isolation oxide, 4 polysilicon, 5 an oxide film, 11 junction, 12 a sidewall oxide film, 13 a gate oxide film, and 14 denotes a gate electrode.

As has been described above, the elevated types of MOSFET as shown in FIGS. 3 to 5 have several advantageous features, over the MOSFET structures according to the prior art. The advantageous features can be summarized as follows: (1) gate length can be determined self-alignedly by the space between elevated source/drain regions and by the thickness of the oxide film on the sidewall of the elevated source/drain region; (2) there is a possibility that the area of the junction region may be determined self-alignedly; and (3) the resistance of source/drain junction can be lowered. Especially, in view of the fact that the smallest dimensions attainable with the current mass-production technology are on the order of 0.5 μm and there are technical problems yet to be solved for realizing further smaller dimensions, the above feature (1) which enables more reductions in size with the current technology is an important factor for further progress of device miniaturization. Besides, in consideration of the above-mentioned need for further rise in substrate concentration, the increases of junction resistance and junction capacitance are inevitable according to the prior-art structures. In this point, the features (2) and (3) offer great advantages.

However, the elevated type MOSFETs have a very serious drawback as to production. The drawback is that the junction at source/drain edges cannot be controlled. In the structure shown in FIG. 3, for example, the junction 11 in the substrate is formed by diffusion from the polysilicon 4 elevated on the substrate. In the diffusion, the impurities must be diffused under the oxide film 12 covering the sidewall of the elevated polysilicon 4 to reach the source/drain edge. Diffusion depth is determined by the thickness of the sidewall oxide film 12, but the film thickness cannot be reduced greatly, from the viewpoints of breakdown voltage and capacitance with respect to the gate electrode. Consequently, the junction will be deep.

The structures shown in FIGS. 4 and 5 have been devised in order to overcome the above drawback. In the structure shown in FIG. 4, control of impurities at source/drain edges is by diffusion from the oxide film 32 which contains the impurities. For the structure of FIG. 5, on the other hand, control of the impurity distribution at source/drain edges by implantation through a gap has been contrived, as described above. However, the impurity diffusion from the oxide film is possible only where large amounts of impurities are preliminarily incorporated in the oxide film. Moreover, the desired diffusion is utterly impossible where the impurities have been introduced into the oxide film by ion implantation or the like. The structure shown in FIG. 5, in addition, requires a complicated and less reliable process which comprises, for example, once filling only the gate region with a photo-resist. According to the process, furthermore, the gate region is assumed to be filled with a photo-resist or the like, and it is difficult to fabricate FETs having different gate dimenions.

SUMMARY OF THE INVENTION

It is an object of this invention to provide an MOS (Metal Oxide Semiconductor) type FET (Field Effect Transistor) which is capable of miniaturization by use of conventional fabrication techniques.

As has been described above, the greatest disadvantage of the elevated type MOSFET is the difficulty in controlling the impurity distribution at source/drain edges. The diffusion of impurities from the oxide film is an ideal method in view of the attendant insulation, but, in practice, such diffusion is expectable only in special cases.

According to this invention, therefore, polysilicon instead of an oxide film is used as a diffusion source. Where the diffusion source is polysilicon, the impurities contained therein will diffuse relatively easily toward a substrate. If the polysilicon is deposited directly on the substrate, however, the polysilicon used as the diffusion source cannot be removed on the substrate. In such a situation, it is impossible to make insulation between elevated source/drain region and gate electrode. In order to fulfill the contradictory requirements for diffusion of impurites and insulation of source/drain region, the following semiconductor structure and fabrication process have been devised according to this invention. The structure and process according to the invention will be described with reference to FIGS. 1 and 2.

The subject-matter of this invention lies in that polysilicon as the aforesaid diffusion source is deposited on a very thin oxide film (not shown in FIGS. 1, 2) which is as thin as a native oxide film, impurities are diffused through the very thin oxide film, and the polysilicon used as the diffusion surce is completely removed by use of the oxide film as an etching stopper, followed by making an insulation between elevated source/drain and gate electrode.

First, the impurities implanted into the polysilicon are caused to diffuse down into the semiconductor substrate, thereby forming a junction in the substrate, as is known. Moreover, a heat treatment required for the diffusion may be carried out at a compratively low temperature. Where the impurities are introduced into the polysilicon by ion implantation or the like, therefore, it is possible to form a desired conduction type junction in the substrate. This is quite different from the case where an oxide film is used as the diffusion source. If the polysilicon served as the diffusion source is left in situ, however, there will be a trouble or failure in insulation between source/drain and gate electrode. Thus, the polysilicon must be removed after serving as the diffusion source. If the polysilicon has been deposited directly on the substrate, however, removal of the polysilicon would cause etching of the underlying substrate. To avoid the substrate etching, a very thin oxide film which is as thin as a native oxide film is preliminarily formed on the substrate, and the polysilicon for use as the diffusion source is deposited on the thin oxide film. The impurities in the polysilicon diffuse through the thin oxide film into the substrate, and the polysilicon is removed by using the oxide film as an etching stopper. With the recent dry-etching, particularly low-temperature dry-etching in which a substrate is cooled to around the liquid nitrogen temperature, it is possible to remote the polysilicon on such a very thin oxide film. In addition, the thin oxide film will not hinder the diffusion of impurities.

In FIGS. 1 and 2, neither the very thin oxide film nor the polysilicon as the diffusion source is shown, since FIGS. 1 and 2 each show a final sectional view of a semiconductor device according to this invention. In these figures, numeral 1 denotes a semiconductor substrate, 2 field insulation oxide, 3 a nitride film, 4 polysilicon which constitutes source/drain, 5 an oxide film, 8 polysilicon which connects the polysilicon 4 to junctions in the substrate, 11 a junction, 12 a sidewall oxide film which does not contain impurities, of the elevated source/drain, 13 a gate oxide film, 14 a gate electrode, 15 interlayer oxide, 16 a metal which fills contacts, and 17 denotes a wiring metal.

As has been described above, polysilicon is deposited on an oxide film which is formed on a substrate and which is as thin as a native oxide film, impurities are diffused through the thin oxide film, and the polysilicon is then completely removed, whereby it is possible to solve the two problems involved in the conventional structures, namely, the control of impurities at source/drain edges and the insulation of gate electrode.

These and other objects and many of the attendant advantages of this invention will be readily appreaciated as the same becomes better understood by reference to the following detailed description when considered in connection with the accompanying drawings.

DETAILED DESCRIPTION OF THE INVENTION

Some embodiments of this invention will now be described below. In a first embodiment, a structure suitable for self-aligned determination of the area of junction and a fabrication process thereof will be described. In a second embodiment, a process will be described which does not enable self-aligned determination of junction but which is simple and easy on a production basis. According to the first and second embodiments, processing of polysilicon is carried out twice on a very thin oxide film, and there is a possibility that the thin oxide film may be lost and the substrate may be processed. Third and fourth embodiments will describe processes which obviate this problem. A fifth embodiment will describe a process which does not use diffusion of impurities through a thin oxide film. One of the features of this invention is that elevated type FETs and conventional type FETs can be fabricated at the same time, and this point will be described in a sixth embodiment. Finally, a description will be made of a CMOS (Complementary MOS) inverter using the semiconductor device according to this invention.

First embodiment

Figure 1:
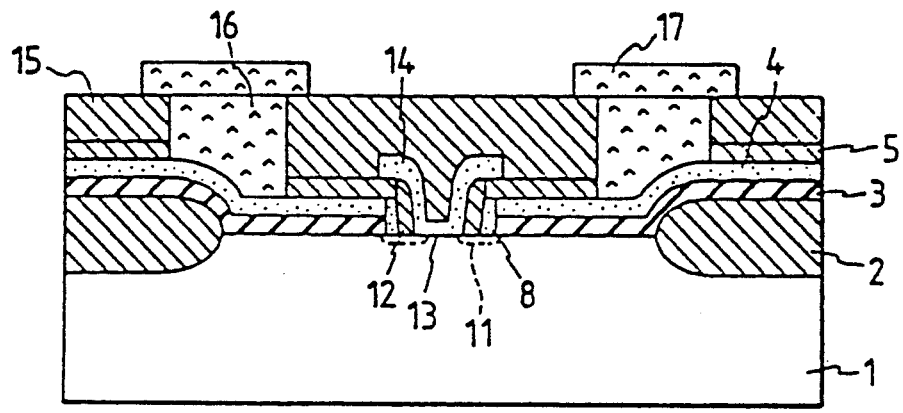
FIG. 1 illustrates a semiconductor device according to a first embodiment of this invention.
Figure 2:
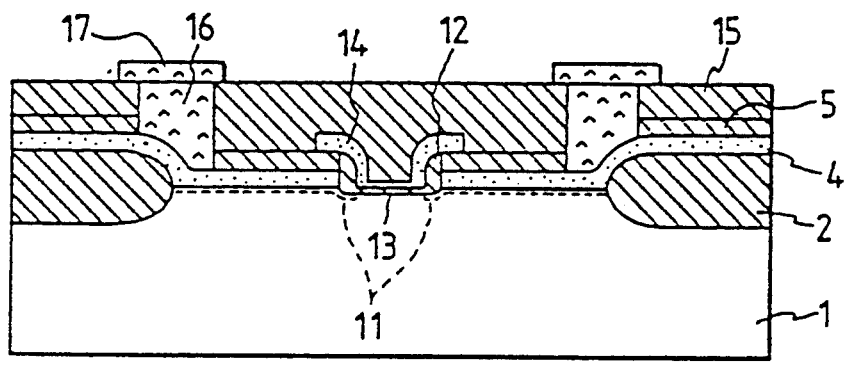
FIG. 2 illustrates a semiconductor device according to a second embodiment of this invention.
Figure 3:
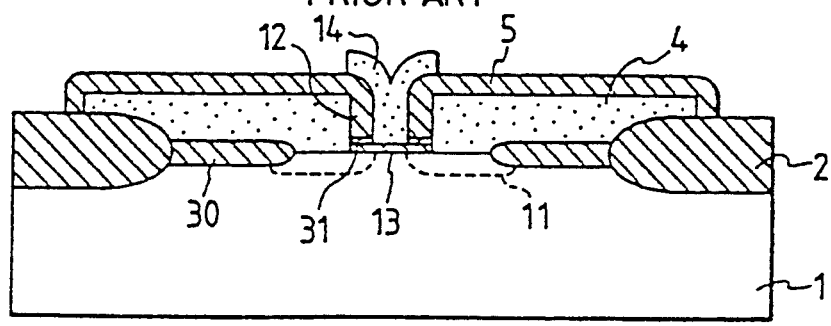
FIG. 3 illustrates a semiconductor device having a first construction according to the prior art.
Figure 4:
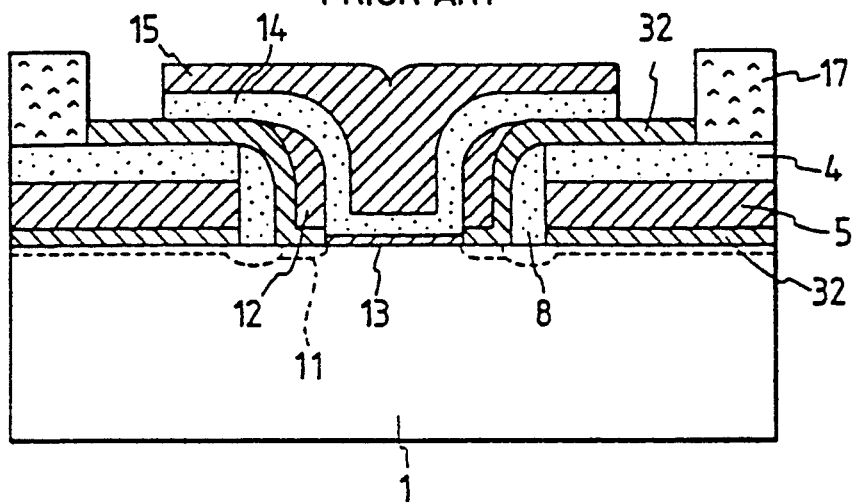
FIG. 4 illustrates a semiconductor device having a second construction according to the prior art.
Figure 5:
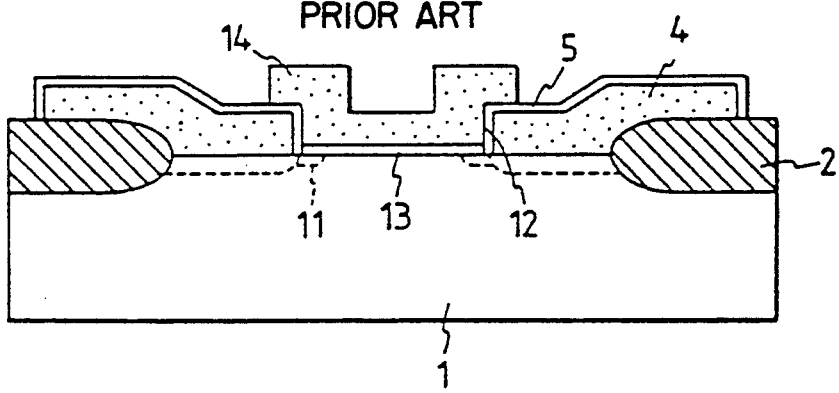
FIG. 5 illustrates a semiconductor device having a third construction according to the prior art.
Figure 6:
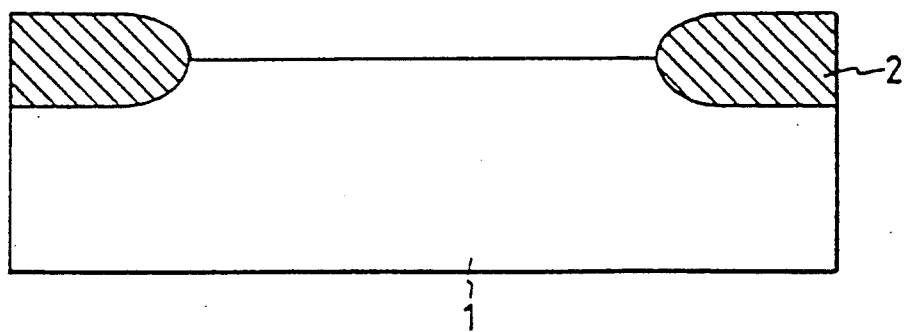
FIG. 6 shows a process step in fabricating the semiconductor device according to the first embodiment of this invention.

First, as shown in FIG. 6, an insulator film for electrical isolation of devices, specifically, a silicon oxide film 2 is formed on a semiconductor substrate (inclusive of well regions formed on the substrate) I by selective oxidation known in the art. More particularly, a nitride film is formed as islands on the substrate, followed directly by oxidation, whereby an oxide film is formed only in regions which are not covered with the nitride film, because the nitride film is impervious to oxygen. According to the invention, an oxide film with about 400 nm thickness was grown at a temperature of 1000° C. This step is preceded by a step of providing the substrate with regions of different conduction types, a step of compensating for deficiency of impurities in the substrate beneath field isolation oxide, and so on. Explanation of such preliminary steps is omitted here, for simplicity. The nitride film used as a mask for selective oxidation is removed, followed by cleaning the exposed surface and growing an oxide film in a thickness of 10 nm, which is not shown in the figure.

Figure 7:
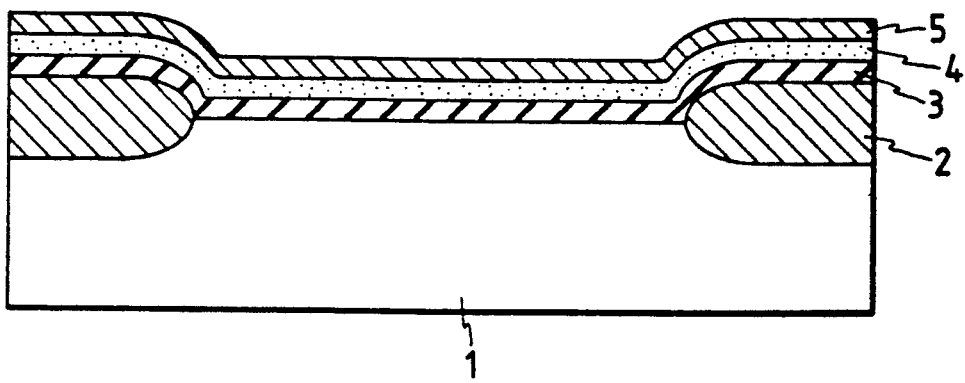
FIG. 7 shows a process step in fabricating the semiconductor device according to the first embodiment of this invention.

Next, as shown in FIG. 7, a composite film consisting of a nitride film 3, a polysilicon film 4 which contains impurities and an oxide film 5 is deposited by CVD (Chemical Vapor Deposition) known in the art. The thickness of each of the films 3 to 5 is 100 nm. The substrate surface is covered with an oxide film, which is not shown here. Introduction of the impurities into the polysilicon 4 was carried out by conventional ion implantation. The impurities to be implanted were selected according to the relevant conduction type, that is, arsenic or phosphorus was selected for n-type FET, and boron for p-type FET.

Figure 8:
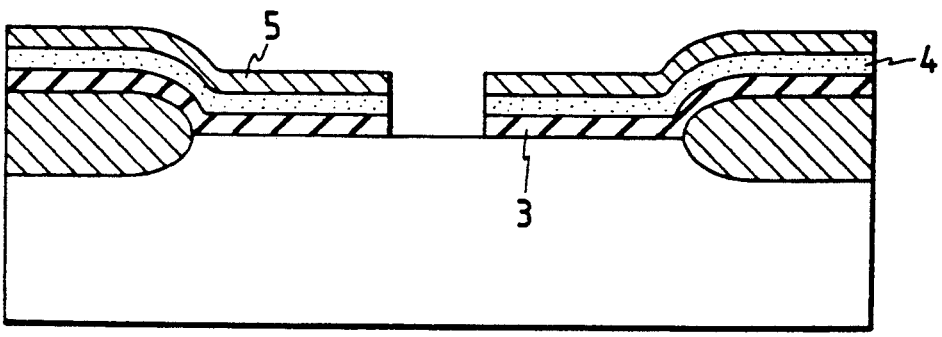
FIG. 8 shows a process step in fabricating the semiconductor device according to the first embodiment of this invention.

Subsequently, as shown in FIG. 8, a gate region is opened to separate the composite film in desired dimensions. In this processing step, an oxide film (not shown) on the substrate serves as an etching stopper for nitride film processing. Formation of a photo-resist pattern in carrying out the processing may be done either by a known single-layer photo-resist technique or by a known multi-layer photo-resist technique.

Figure 9:
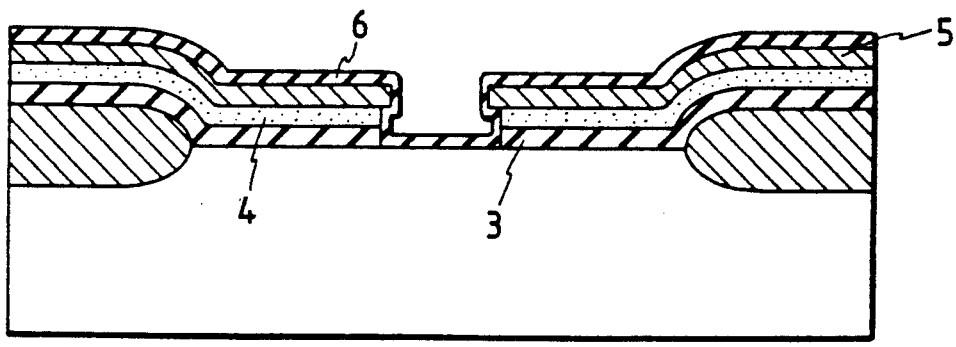
FIG. 9 shows a process step in fabricating the semiconductor device according to the first embodiment of this invention.
Figure 10:
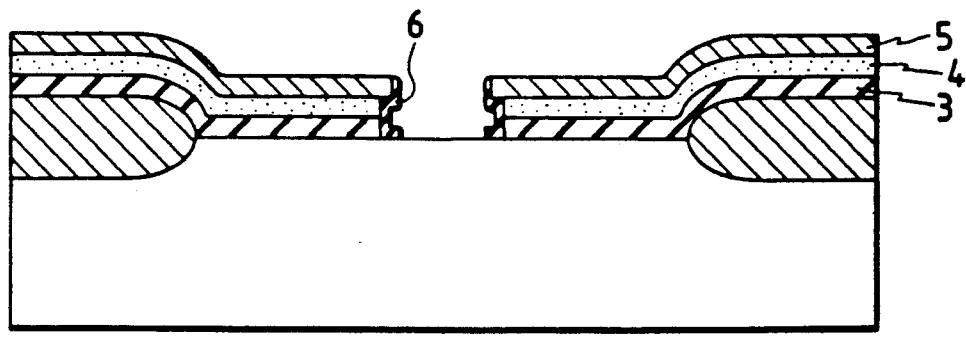
FIG. 10 shows a process step in fabricating the semiconductor device according to the first embodiment of this invention.

The nitride film 3 and the polysilicon film 4 are then etched horizontally so that the oxide film 5 overhang, like eaves. Then, as shown in FIG. 9, a nitride film 6 is deposited in a thickness of about 5 nm. Use of the known low-pressure CVD, promising good step coverage, causes the nitride film 6 to be grown also on the lower side of the overhang of the oxide film 5, as shown in FIG. 9. In this condition, anisotropic dry-etching of the nitride film 6 is carried out. Upon the etching, the nitride film 6 is left only on the sidewall, on the lower surface of the overhang and on the substrate surface shadowed by the overhang, resulting in the profile shown in FIG. 10. Because the anisotropic dry-etching is an etching by use of highly directional ions, the structure can be realized easily.

Figure 11:
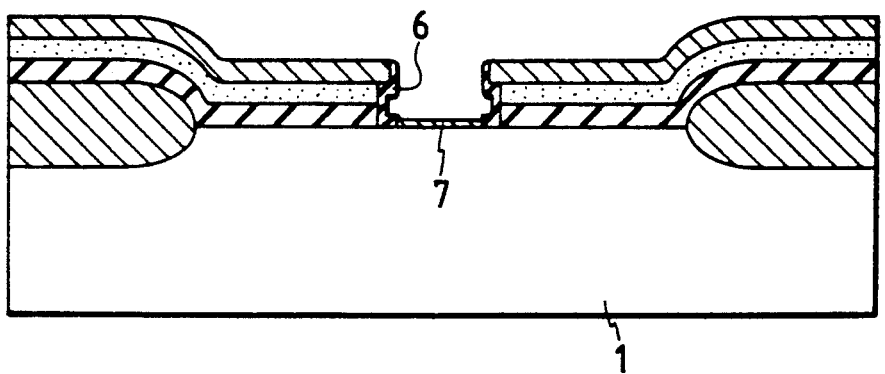
FIG. 11 shows a process step in fabricating the semiconductor device according to the first embodiment of this invention.

The nitride film 6 thus left is then used as a mask to carry out selective oxidation of the substrate surface, thereby growing an oxide film 7 only on the exposed substrate surface, as shown in FIG. 11. The oxide film 7 is destined only to serve as an etching stopper for a polysilicon film which is subsequently formed. In this embodiment, therefore, the oxide film 7 was grown in a thickness of about 20 nm.

Figure 12:
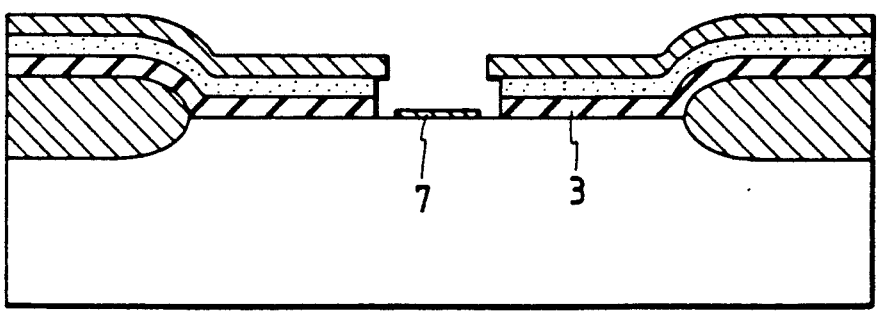
FIG. 12 shows a process step in fabricating the semiconductor device according to the first embodiment of this invention.

Subsequently, the nitride film 6 used as the mask for selective oxidation is removed, as shown in FIG. 12. Although the nitride film 3 deposited on the substrate is also etched during the removal of the film 6, the difference in thickness between the nitride films 3 and 6 prevents the film 3 from being lost completely.

Figure 13:
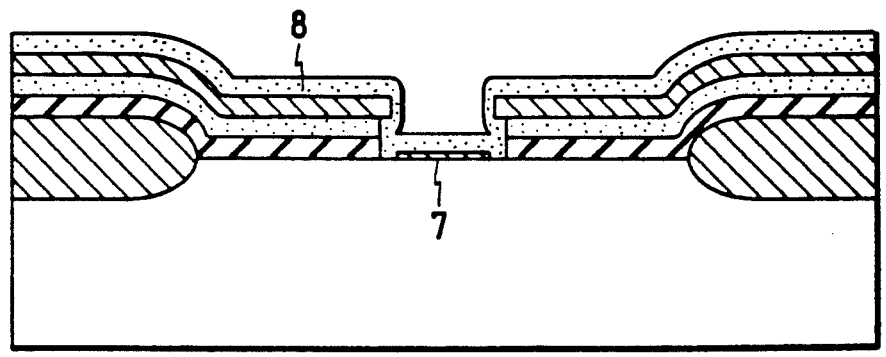
FIG. 13 shows a process step in fabricating the semiconductor device according to the first embodiment of this invention.

Then, polysilicon 8 is deposited as shown in FIG. 13. Where the deposition of polysilicon is also carried out by the known low pressure CVD, the polysilicon is deposited also on the lower side of the overhang, as shown in FIG. 13. Thereafter, the polysilicon 8 is turned into a desired conduction type by ion implantation. In this case, oblique ion implantation was adopted so that the impurities get to the lower side of the overhang.

Figure 14:
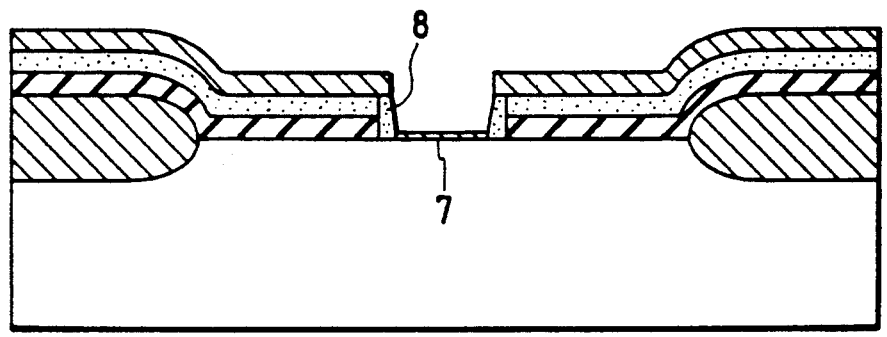
FIG. 14 shows a process step in fabricating the semiconductor device according to the first embodiment of this invention.

Etching is then carried out to leave the polysilicon 8 only under the overhang, as shown in FIG. 14. In the etching, the oxide film 7 on the substrate surface functions as an etching stopper for the polysilicon, to avoid the substrate etching.

Figure 15:
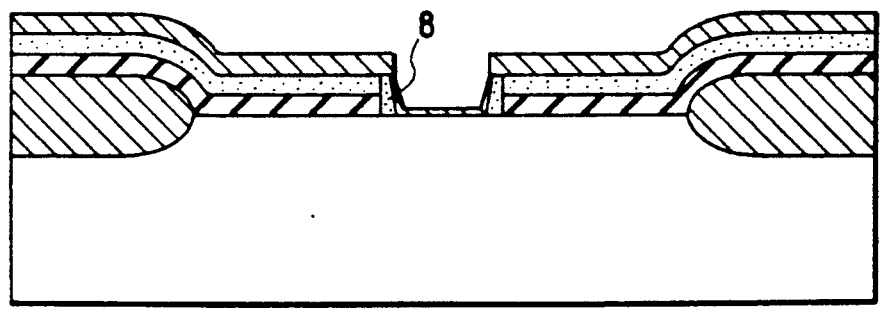
FIG. 15 shows a process step in fabricating the semiconductor device according to the first embodiment of this invention.

After the removal of the oxide film 7 served as the etching stopper, a very thin oxide film 9 is formed on the substrate surface and on the surface of sidewall polysilicon 8, as shown in FIG. 15. The thickness of the oxide film 9 should be such that the film 9 does not hinder the impurity diffusion and is able to serve as an etching stopper for the polysilicon 8. As has been described above, use of the known low-temperature dry-etching ensures that an oxide film with a thickness of about 10 to 20 Å can serve as an etching stopper for the polysilicon film. In this embodiment, therefore, the oxide film was formed chemically by immersion in an acid, such as nitric acid and hydrogen peroxide, which is able to form an oxide film on a silicon surface. Films formed by such techniques are imperfect oxide films, as contrasted to films formed by thermal oxidation or the like; however, the imperfect oxide films are convenient for diffusion of impurities. In addition, the oxide film with the above-mentioned thickness is sufficient for the polysilicon processing thereon, provided that low-temperature dry-etching is used.

Figure 16:
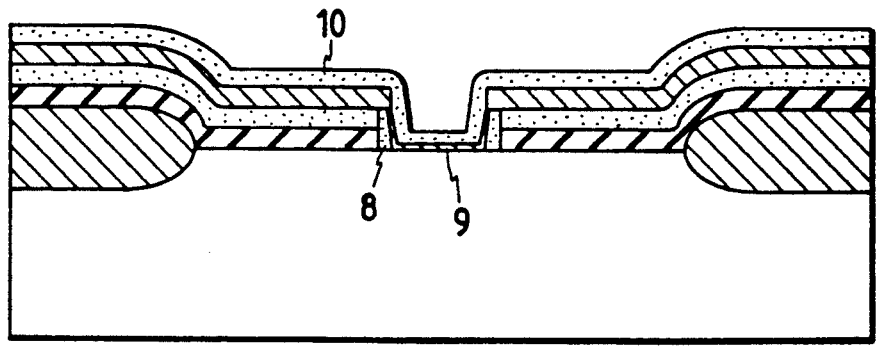
FIG. 16 shows a process step in fabricating the semiconductor device according to the first embodiment of this invention.

Subsequently, polysilicon 10 which will constitute a source of impurity diffusion into the substrate is deposited, as shown in FIG. 16. After introduction of impurities for obtaining a desired conduction type, the polysilicon film 10 is processed by the known anisotropic dry-etching, with the very thin oxide film as an etching stopper. In this case, the substrate was cooled to the liquid nitrogen temperature, and a plasma of $SF_6$ generated by microwave discharge was used to process the polysilicon.

Figure 17:
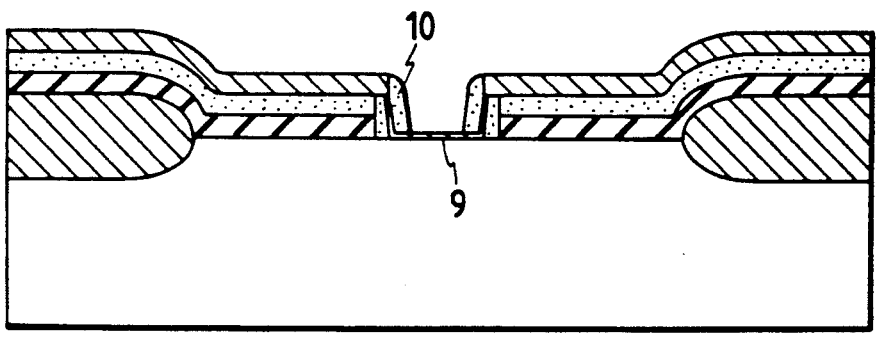
FIG. 17 shows a process step in fabricating the semiconductor device according to the first embodiment of this invention.
Figure 18:
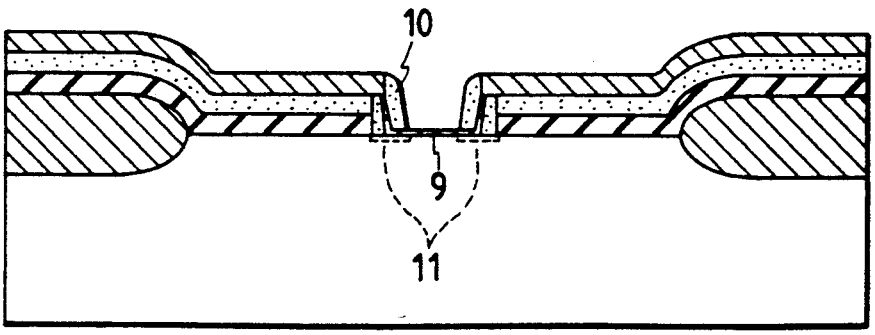
FIG. 18 shows a process step in fabricating the semiconductor device according to the first embodiment of this invention.
Figure 19:
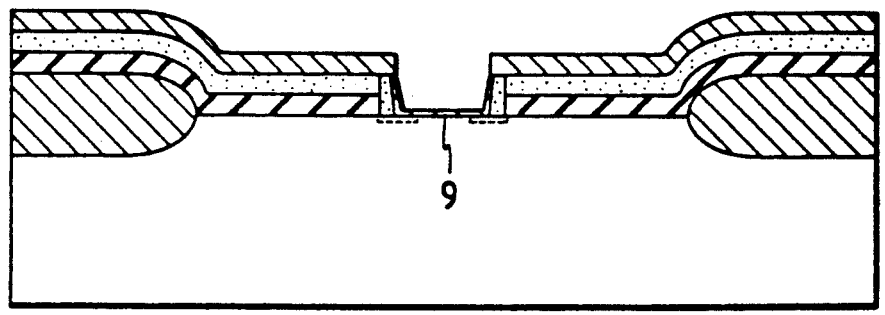
FIG. 19 shows a process step in fabricating the semiconductor device according to the first embodiment of this invention.

As a result, the polysilicon 10 is left only on the sidewall, as shown in FIG. 17. Then the remaining polysilicon 10 is subjected to a heat treatment, whereby the impurities contained in the polysilicon 10 are diffused down through the oxide film 9 into the substrate, to form a junction 11 (FIG. 18). The heat treatment may be carried out by conventional furnace heating, or by a ramp heating or other method of instantaneously heating the substrate. It is noted, however, that strict control of the heat treatment ambient should be made to prevent the oxide film formation on the surface of the polysilicon 10 serving as the diffusion source. If an oxide film might be formed also on the polysilicon surface by the heat treatment, the subsequent highly selective etching carried out on the very thin oxide film 9 in order to remove the diffusion source polysilicon 10 completely, as shown in FIG. 19, would fail to give the desired results. In this embodiment, the substrate was maintained in a nitrogen ambient throughout heating and cooling, as well as at the heat treatment temperature, to avoid the contact of the substrate with the atmospheric air while the substrate is hot.

Figure 20:
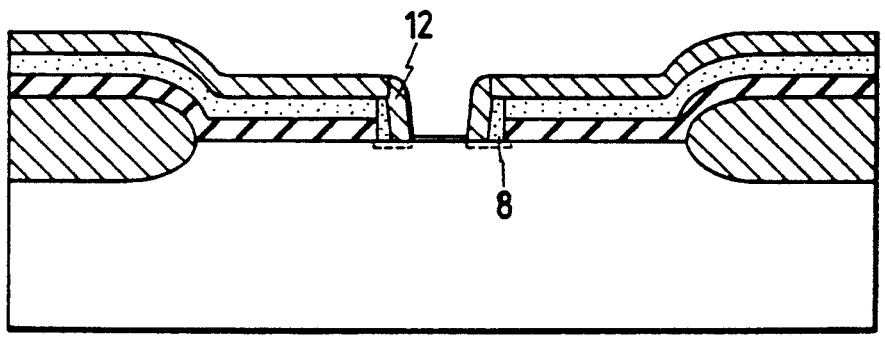
FIG. 20 shows a process step in fabricating the semiconductor device according to the first embodiment of this invention.

Further, the thin oxide film 9 served as the etching stopper for the polysilicon 10 is removed, and an oxide film 12 is deposited in a thickness of about 100 nm on the entire substrate surface by CVD. The oxide film 12 is then subjected to anisotropic etching. Upon the etching, the oxide film is left only on the sidewall in the state of covering the sidewall polysilicon 8, as shown in FIG. 20. Thus, the polysilicon is wholly insulated from a gate electrode.

Figure 21:
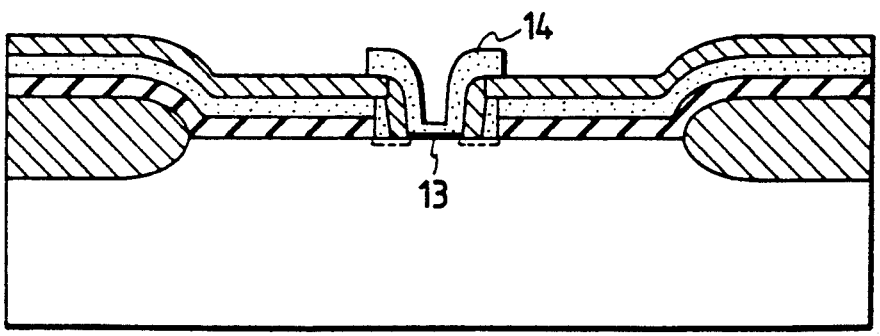
FIG. 21 shows a process step in fabricating the semiconductor device according to the first embodiment of this invention.
Figure 22:
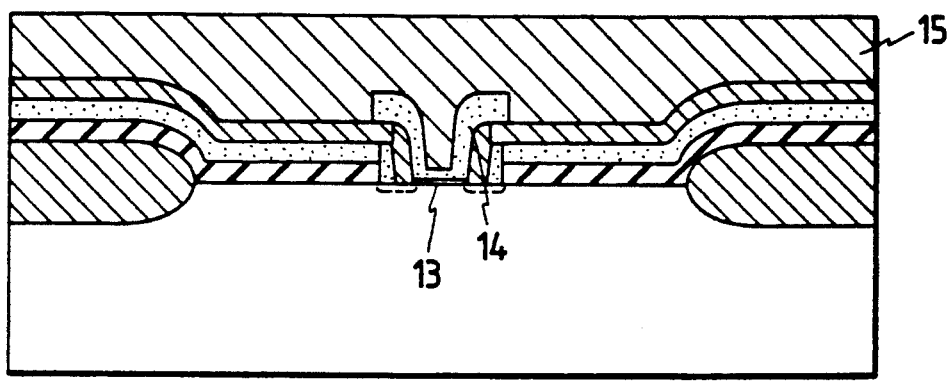
FIG. 22 shows a process step in fabricating the semiconductor device according to the first embodiment of this invention.
Figure 23:
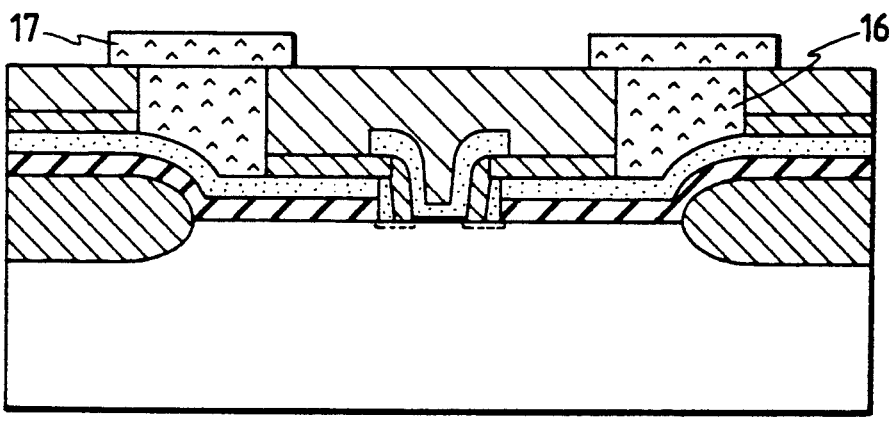
FIG. 23 shows a process step in fabricating the semiconductor device according to the first embodiment of this invention.

From this stage on, processing is carried out in the conventional manner. That is, the substrate surface is cleaned, a gate oxide film 13 is grown, then polysilicon is deposited and processed into a desired shape to form a gate electrode 14, as shown in FIG. 21. This processing is normally preceded by a step of implanting impurity species into the substrate for improvement of FET punch-through properties and a step of ion implantation for threshold voltage adjustment, but such steps are omitted from description here. Also, the gate electrode 14 may comprise a metal film deposited on the polysilicon so as to obtain a lower resistance, but explanation of such technique is omitted here. After the formation of gate electrode, an interlayer oxide film 15 is deposited (FIG. 22), then contact holes are opened and then filled with a metal 16, and a wiring layer 17 is formed, as shown in FIG. 23. In practice, contacts are also provided for the gate electrode 14 and for the substrate, though not seen in this cross section.

Thus, according to the first embodiment of this invention, the area of junction can be minimized self-alignedly, though depending on the gate width. In addition, it is possible to achieve control of impurities at source/drain edges, which has been a problem in elevated FETs of the conventional structure.

According to the process of the first embodiment, it is possible to form the junction self-alignedly, with the result of a minimized junction area and a reduced junction capacitance. However, these merits are accompanied by complicated fabrication procedures. In view of this, a second embodiment will be described below in which junction is not self-aligned but fabrication is simplified.

Second embodiment

Figure 24:
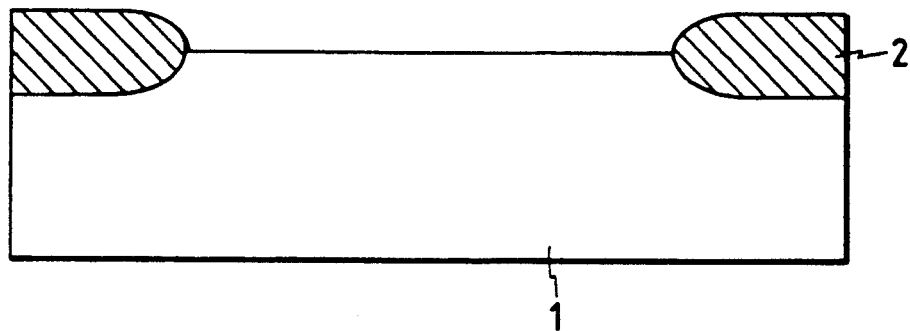
FIG. 24 shows a process step in fabricating the semiconductor device according to the second embodiment of this invention.
Figure 25:
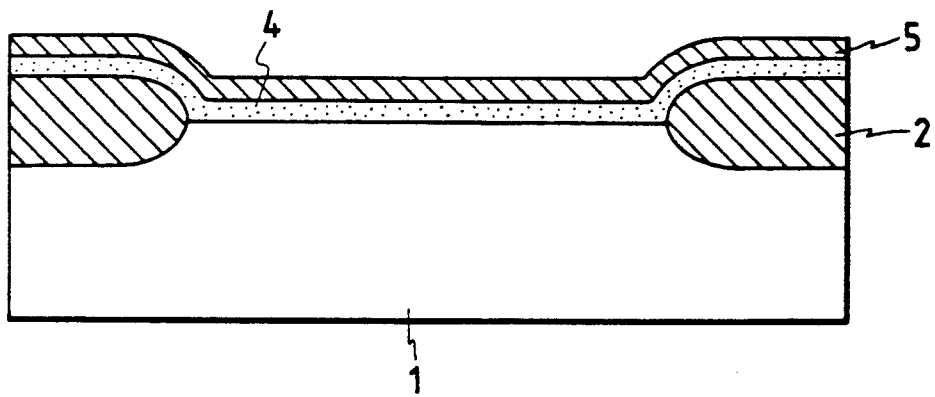
FIG. 25 shows a process step in fabricating the semiconductor device according to the second embodiment of this invention.

First, as in the above embodiment, a field isolation oxide 2 is grown on a semiconductor substrate 1 (FIG. 24). The growing conditions and the like are the same as in the first embodiment. Next, oxide film and the like are removed from the substrate surface, thereby exposing the substrate surface, and a composite film consisting of a polysilicon film 4 and an oxide film 5 is deposited thereon, as shown in FIG. 25. Desired impurities are preliminarily introduced into the polysilicon 4 by ion implantation or the like, but a heat treatment for diffusing the impurities is not carried out, because such heat treatment leads to a deeper junction. Deposition of the oxide film 5 on the polysilicon film 4 is also carried out at a temperature as low as possible. In this embodiment, the deposition was carried out at 700° C.

Figure 26:
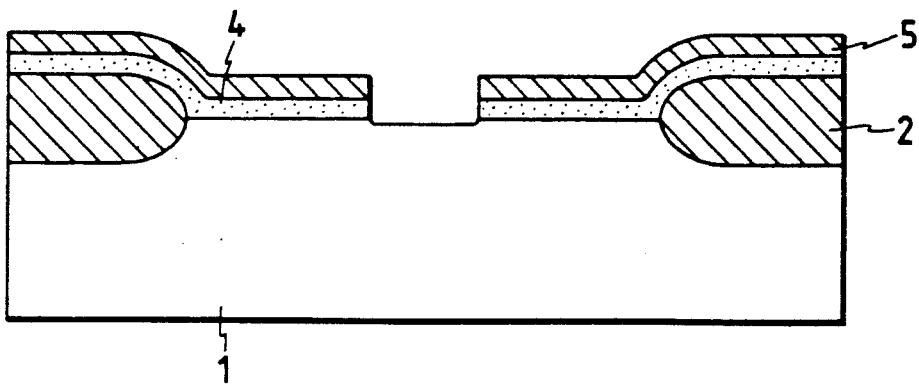
FIG. 26 shows a process step in fabricating the semiconductor device according to the second embodiment of this invention.

A photo-resist pattern is then formed, and the polysilicon film 4 and the oxide film 5 are separated into desired shapes. Because the polysilicon 4 is processed on the silicon substrate I, the substrate is also etched to a certain extent, as shown in FIG. 26. For minimizing the substrate etch, controllability of the intended etching should be raised. In this embodiment, the substrate etch was about 60 nm.

Figure 27:
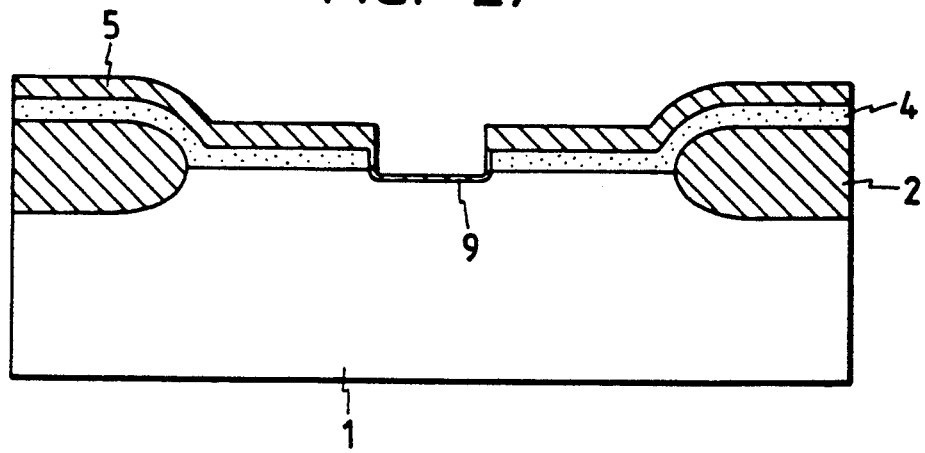
FIG. 27 shows a process step in fabricating the semiconductor device according to the second embodiment of this invention.
Figure 28:
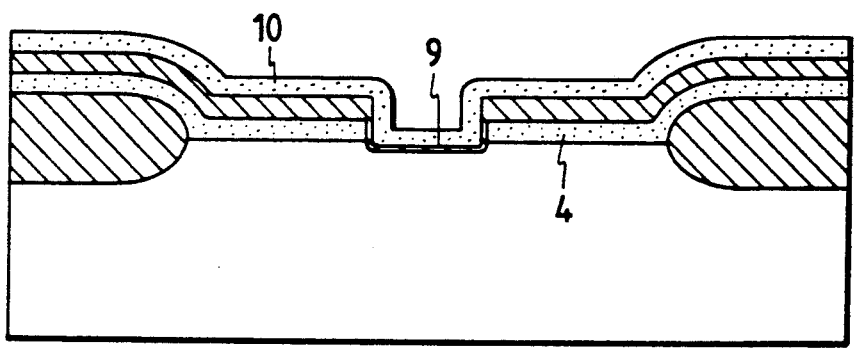
FIG. 28 shows a process step in fabricating the semiconductor device according to the second embodiment of this invention.
Figure 29:
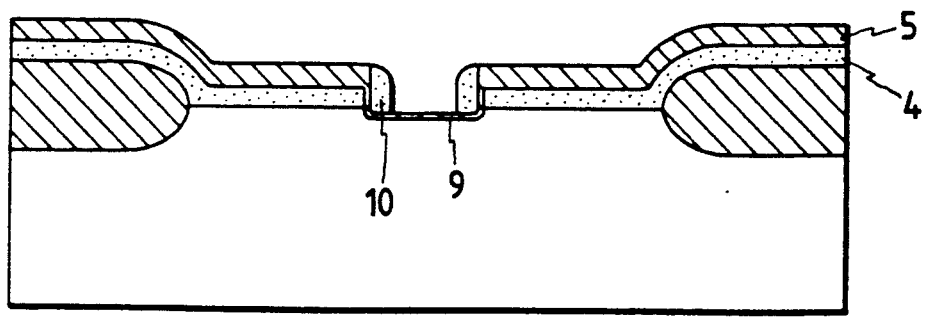
FIG. 29 shows a process step in fabricating the semiconductor device according to the second embodiment of this invention.
Figure 30:
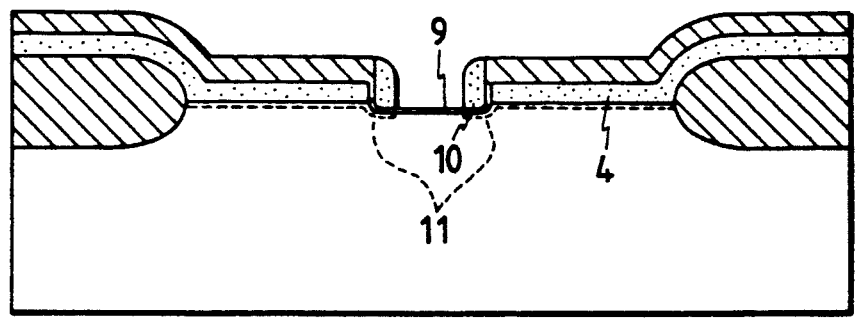
FIG. 30 shows a process step in fabricating the semiconductor device according to the second embodiment of this invention.

Then, as shown in FIG. 27, a very thin oxide film 9 is grown on the exposed surface of the substrate and on side surfaces of the polysilicon 4, in the same manner as in the first embodiment. Subsequently, polysilicon 10 is again deposited as shown in FIG. 28, and is converted to a desired conduction type. Further, as in the first embodiment, the polysilicon 10 is etched using the very thin oxide film 9 as an etching stopper. As a result, the polysilicon 10 which contains impurities is left only on the sidewall, as shown in FIG. 29. Application of a heat treatment causes diffusion of the impurities from the polysilicon 4 on the substrate and from the sidewall polysilicon 10, resulting in the formation of junction 11 in the substrate, as shown in FIG. 30.

Figure 31:
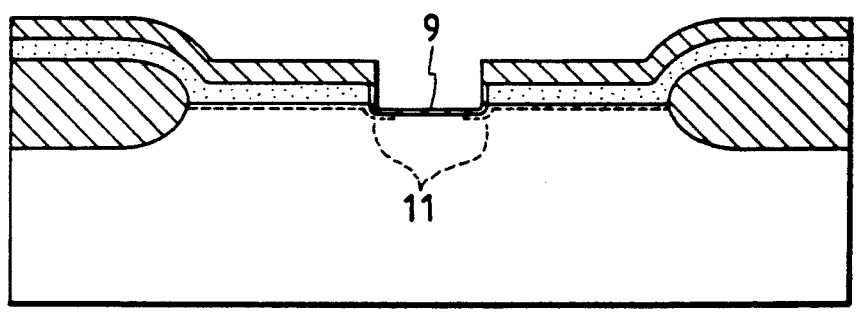
FIG. 31 shows a process step in fabricating the semiconductor device according to the second embodiment of this invention.

The polysilicon 10 served as a diffusion source is removed completely, as shown in FIG. 31, by using the very thin oxide film 9 as an etching stopper and under conditions which avoid the substrate etching. To achieve this, strict control of the heat treatment ambient for obviating the growth of oxide film on the polysilicon surface during the heat treatment should be made, as has been described above.

Figure 32:
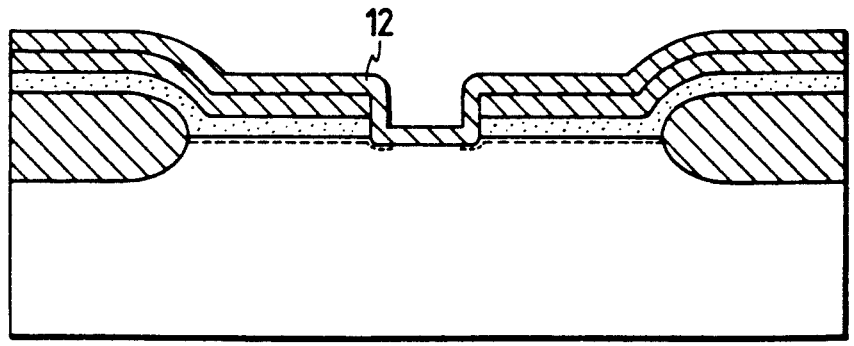
FIG. 32 shows a process step in fabricating the semiconductor device according to the second embodiment of this invention.
Figure 33:
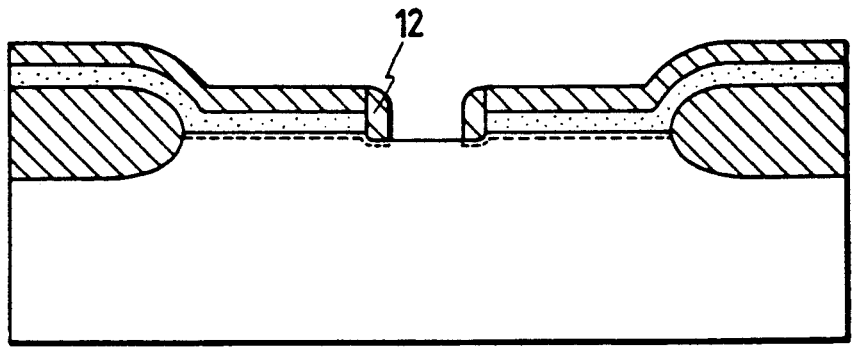
FIG. 33 shows a process step in fabricating the semiconductor device according to the second embodiment of this invention.
Figure 34:
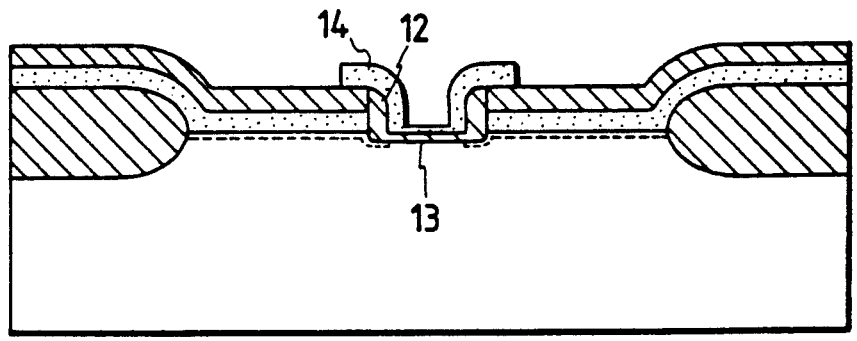
FIG. 34 shows a process step in fabricating the semiconductor device according to the second embodiment of this invention.
Figure 35:
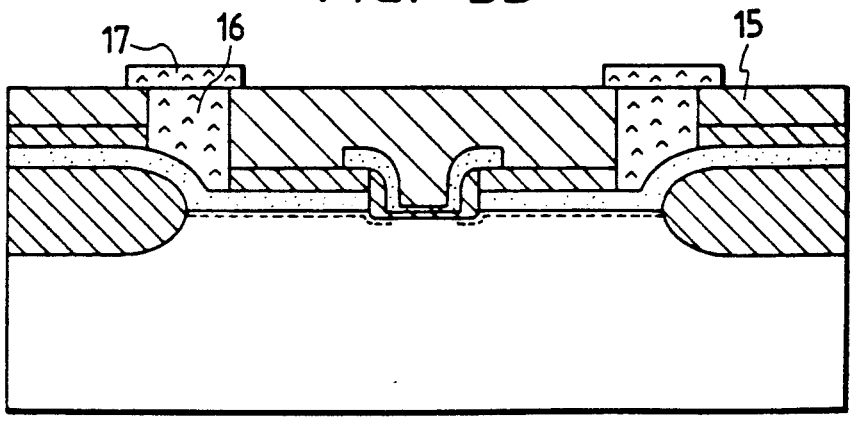
FIG. 35 shows a process step in fabricating the semiconductor device according to the second embodiment of this invention.
Figure 36:
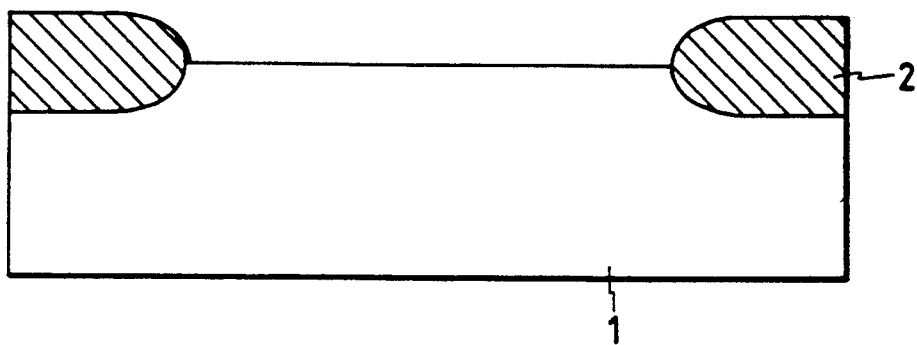
FIG. 36 shows a process step in fabricating the semiconductor device according to the third embodiment of this invention.
Figure 37:
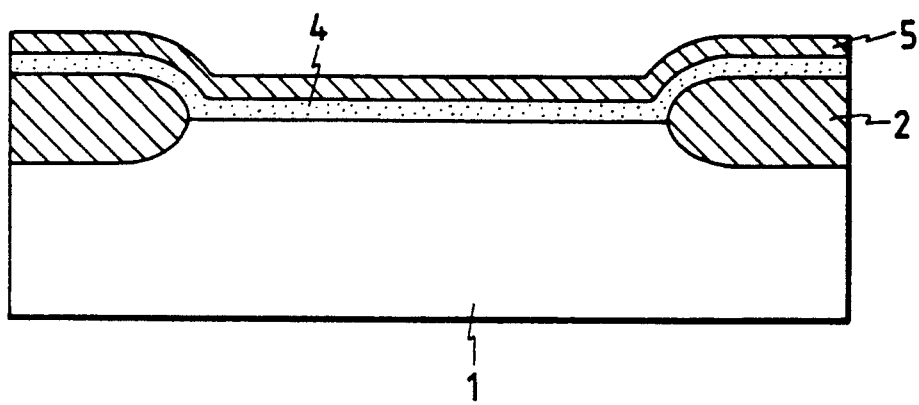
FIG. 37 shows a process step in fabricating the semiconductor device according to the third embodiment of this invention.
Figure 38:
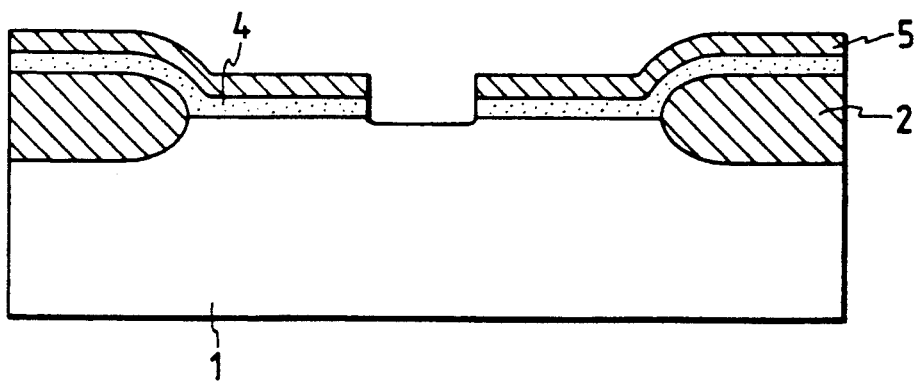
FIG. 38 shows a process step in fabricating the semiconductor device according to the third embodiment of this invention.

The subsequent process steps are the same as in the first embodiment. First, an oxide film is deposited as shown in FIG. 32, and the oxide film is subjected to anisotropic etching to form a sidewall oxide film 12, as shown in FIG. 33. The sidewall oxide film 12 is substantially free of impurities, and insulates the sidewall of the polysilicon 10. Then, growth of a gate oxide film 13 and formation of a gate electrode 14 are carried out (FIG. 34), and, finally, an interlayer oxide film 15 and wiring layers 16 and 17 are formed, as shown in FIG. 35, to complete the desired FET.

Thus, according to this embodiment, a miniaturized FET can be fabricated through a comparatively simple process, although the junction area cannot be determined self-alignedly. An increase in junction area is undesirable from the viewpoint of device performance. This factor, however, is determined by mask alignment between the elevated source/drain and the field isolation oxide, and the structure according to this embodiment does not necessarily lead to an increased junction area. Because contacts are formed on the polysilicon projecting over the field isolation oxide, the structure of this embodiment rather enables a decreased junction area.

In each of the first and second embodiments, etching of polysilicon must be carried out twice, on a very thin oxide film. The first etching is for leaving the polysilicon as a diffusion source of impurities on the sidewall of elevated source/drain region, and the second etching is for the complete removal of polysilicon. The above-described low-temperature dry-etching is characterized in that a very high selectivity can be attained between polysilicon and oxide film. However, an oxide film which is chemically formed in a thickness of about 10 Å cannot endure the two etching steps, as has been described above. During the removal of polysilicon, therefore, the underlying substrate might be etched. To avoid this problem, a third embodiment as described below has been devised.

Third embodiment

Figure 39:
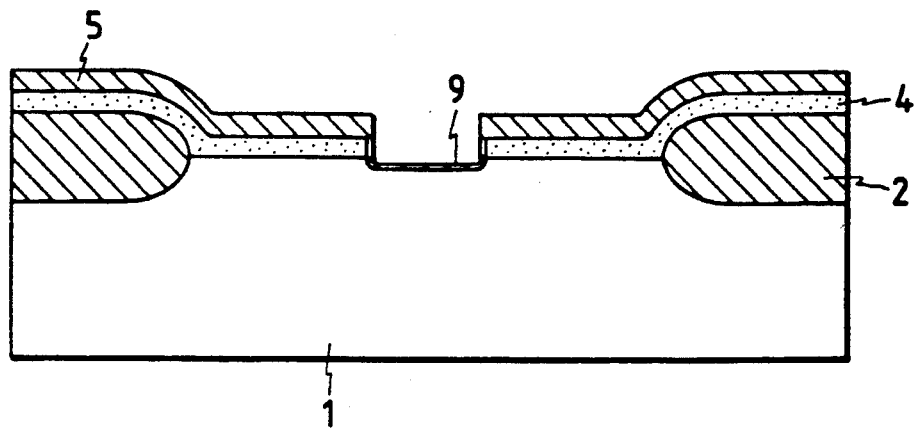
FIG. 39 shows a process step in fabricating the semiconductor device according to the third embodiment of this invention.
Figure 40:
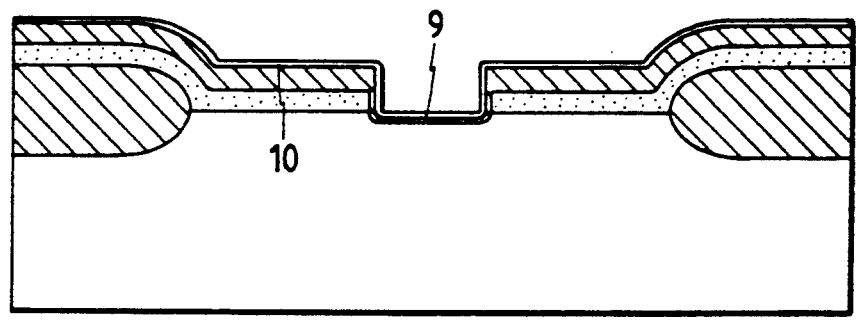
FIG. 40 shows a process step in fabricating the semiconductor device according to the third embodiment of this invention.
Figure 41:
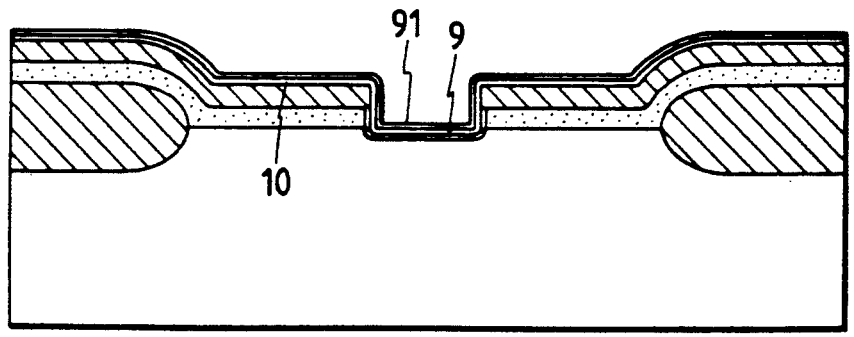
FIG. 41 shows a process step in fabricating the semiconductor device according to the third embodiment of this invention.

In this third embodiment, process steps shown in FIGS. 36 to 39 are the same as those in the second embodiment. Then, a thin oxide film 9 is chemically grown on a substrate 1 and the sidewall of polysilicon 4, as shown in FIG. 39, and polysilicon 10 to be used as a diffusion source of impurities is deposited thereon by CVD. In this case, a very thin silicon film is first deposited as shown in FIG. 40. The thickness of the silicon film is 8 nm. Setting the film thickness to below this value leads to the so-called island growth of silicon, instead of uniform growth. After the silicon is grown to the desired film thickness, the substrate is once drawn out of a furnace, for permitting a native oxide film 91 to grow on the silicon film. The silicon film is deposited at about 500° C. When the silicon film heated to that temperature is exposed to the atmospheric air, a native oxide film grows to a thickness of about 10 Å. Besides, silicon film deposited at about 500° C. are not polycrystalline but amorphous. The amorphous state is suitable for thinner film growth. Consequently, a structure having the silicon film 10 covered with the native oxide film 91 is obtained, as shown in FIG. 41.

Figure 42:
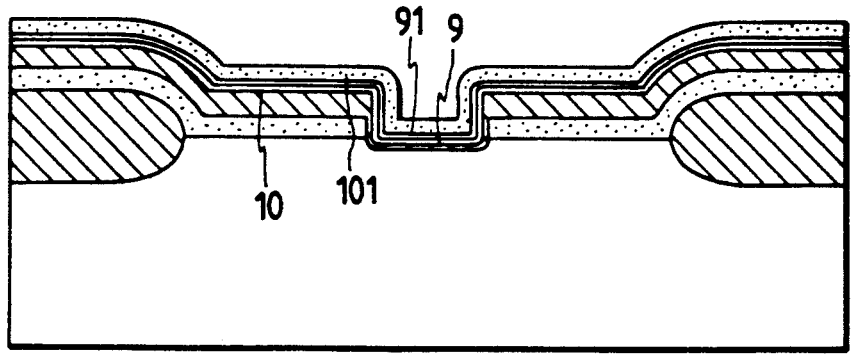
FIG. 42 shows a process step in fabricating the semiconductor device according to the third embodiment of this invention.
Figure 43:
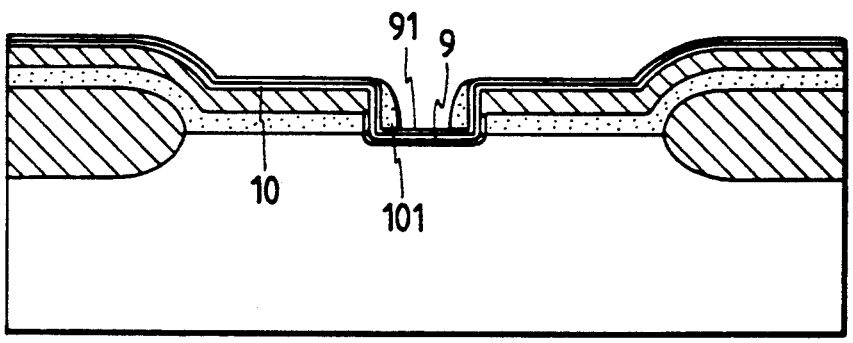
FIG. 43 shows a process step in fabricating the semiconductor device according to the third embodiment of this invention.
Figure 44:
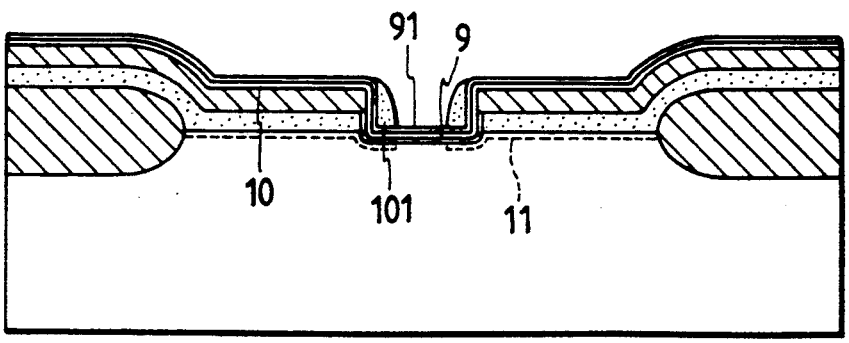
FIG. 44 shows a process step in fabricating the semiconductor device according to the third embodiment of this invention.

Subsequently, as shown in FIG. 42, a silicon film 101 is deposited on the silicon film 10 coated with the native oxide film 91, under the same deposition conditions as above. The thickness of the silicon film 101 is about 100 nm. In order to turn the silicon film 101 into the desired conduction type, impurities are introduced therein by ion implantation. Further, the polysilicon 101 as a diffusion source of impurities is processed to be left only on the sidewall of the elevated source/drain region, as shown in FIG. 43. The processing is so controlled that the silicon etching is stopped by the native oxide film 91 on the initially deposited silicon film. Then, a heat treatment is conducted so that the impurities in the silicon film 101 are diffused downward through the oxide film 91, the about 8 nm silicon film 10 and the oxide film 9 into the substrate 1, as shown in FIG. 44. The amorphous silicon film is transformed to polysilicon by the heat treatment.

Figure 45:
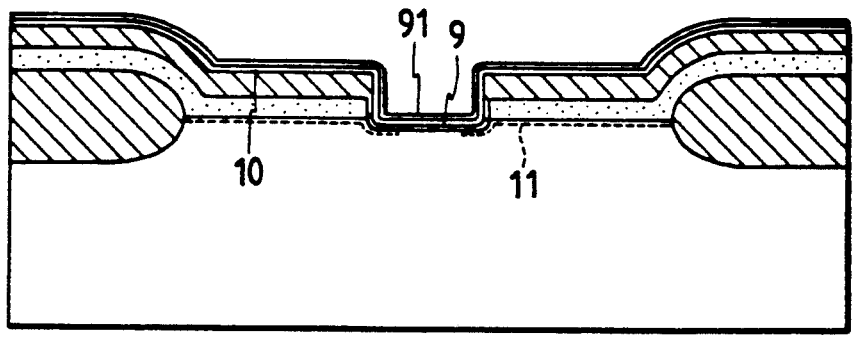
FIG. 45 shows a process step in fabricating the semiconductor device according to the third embodiment of this invention.
Figure 46:
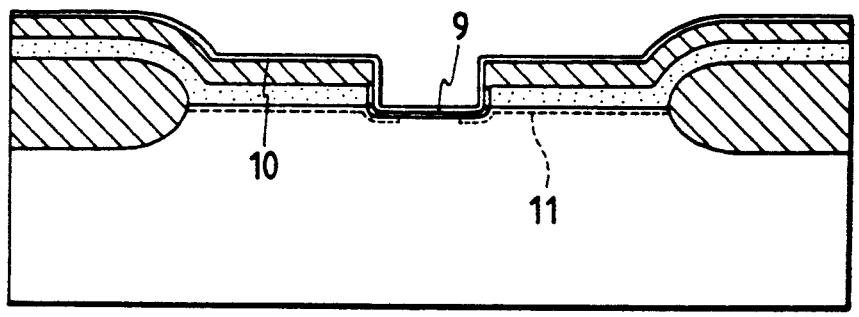
FIG. 46 shows a process step in fabricating the semiconductor device according to the third embodiment of this invention.
Figure 47:
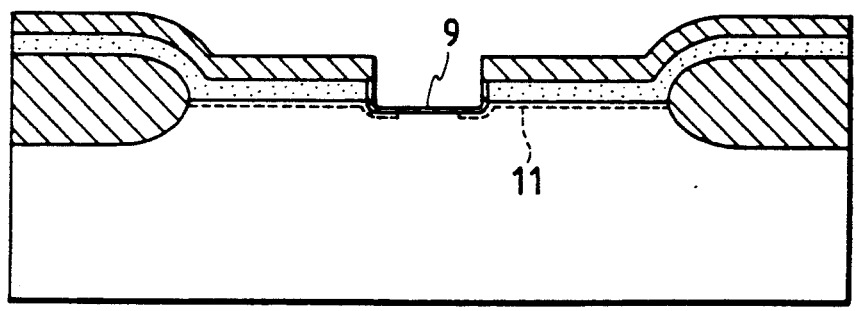
FIG. 47 shows a process step in fabricating the semiconductor device according to the third embodiment of this invention.
Figure 48:
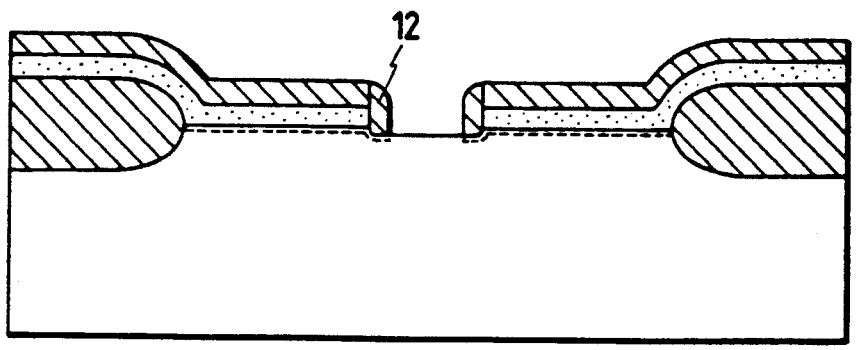
FIG. 48 shows a process step in fabricating the semiconductor device according to the third embodiment of this invention.
Figure 49:
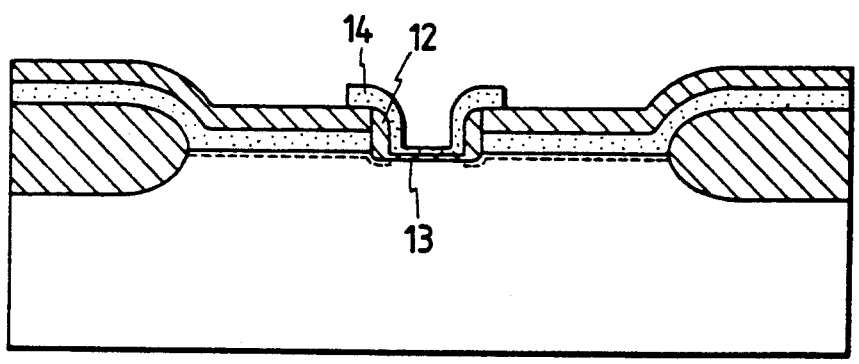
FIG. 49 shows a process step in fabricating the semiconductor device according to the third embodiment of this invention.
Figure 50:
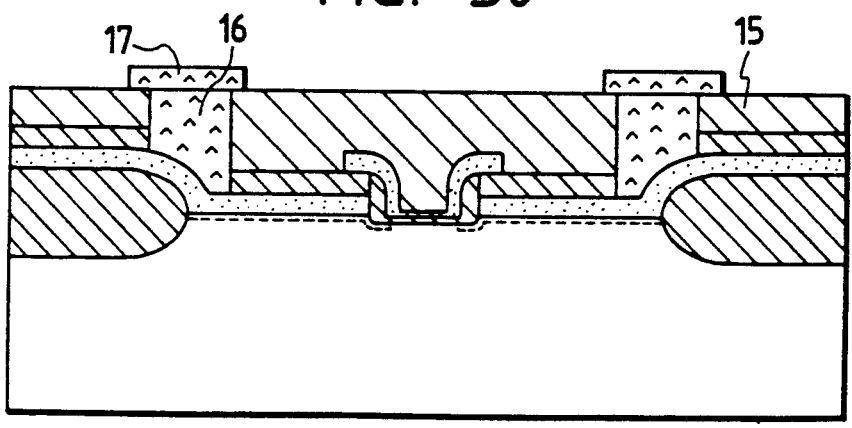
FIG. 50 shows a process step in fabricating the semiconductor device according to the third embodiment of this invention.

Next, the polysilicon film 101 served as the diffusion source is completely removed, as shown in FIG. 45, by use of the underlying oxide film 91 as an etching stopper. After the oxide film 91 as the etching stopper is removed by use of a hydrogen fluoride solution (FIG. 46), the low-temperature dry-etching which promises high selectivity is again carried out, with the thin oxide film 9 on the substrate as an etching stopper, whereby the remaining silicon film 10 is removed completely and the structure shown in FIG. 47 is obtained. Thereafter, the desired FET is completed through the process steps shown in FIG. 48 to 50, which are the same as in the second embodiment and explanation of which is omitted here. According to the process described in this embodiment, it is unnecessary to etch the silicon film twice on an oxide film which is comparable in thickness to a native oxide film; therefore, the silicon film can be removed while avoiding the substrate etching which would occur in the processes according to the first and second embodiments. Furthermore, both the silicon film and the native oxide film thereon are so thin as not to hinder the diffusion of impurities.

According to the third embodiment, the step of carrying out dry-etching twice on a very thin oxide film on the substrate surface can be eliminated. However, this process contains several complicated procedures such as double polysilicon deposition and impurity diffusion through thin silicon film. To overcome the difficulties, the following fourth embodiment has been contrived.

Fourth embodiment

Figure 51:
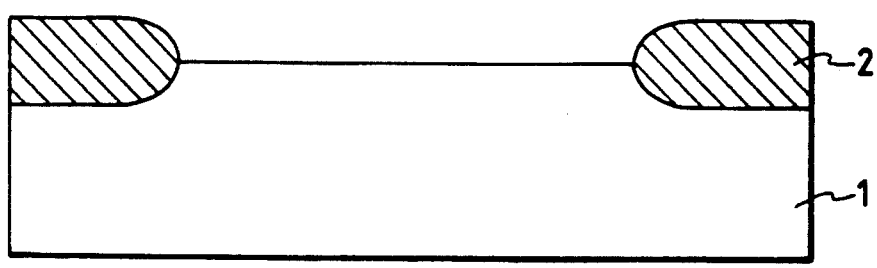
FIG. 51 shows a process step in fabricating the semiconductor device according to the fourth embodiment of this invention.
Figure 52:
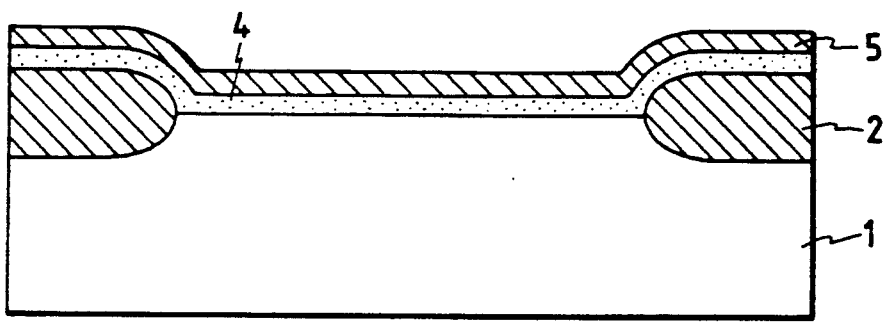
FIG. 52 shows a process step in fabricating the semiconductor device according to the fourth embodiment of this invention.
Figure 53:
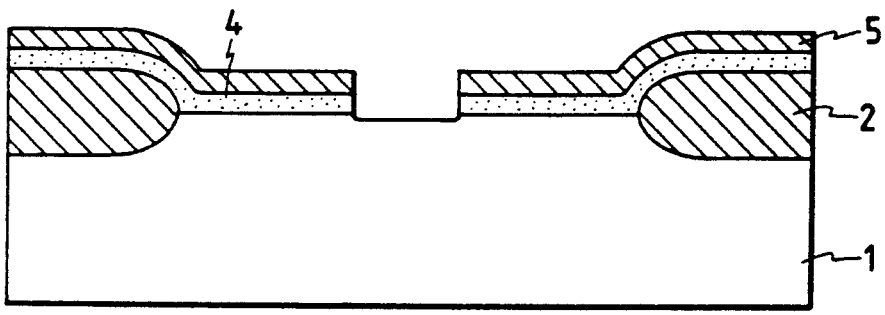
FIG. 53 shows a process step in fabricating the semiconductor device according to the fourth embodiment of this invention.
Figure 54:
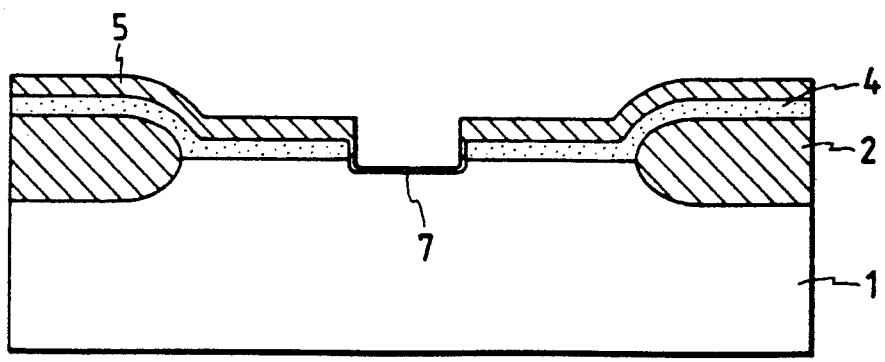
FIG. 54 shows a process step in fabricating the semiconductor device according to the fourth embodiment of this invention.
Figure 55:
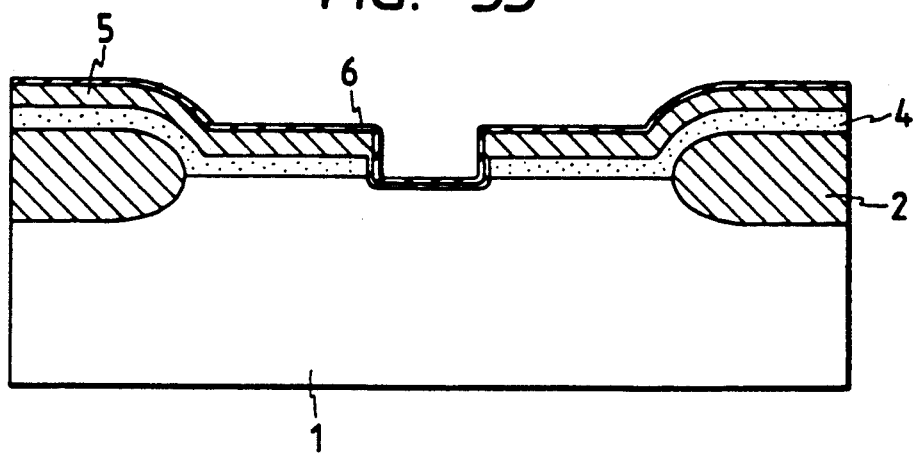
FIG. 55 shows a process step in fabricating the semiconductor device according to the fourth embodiment of this invention.
Figure 56:
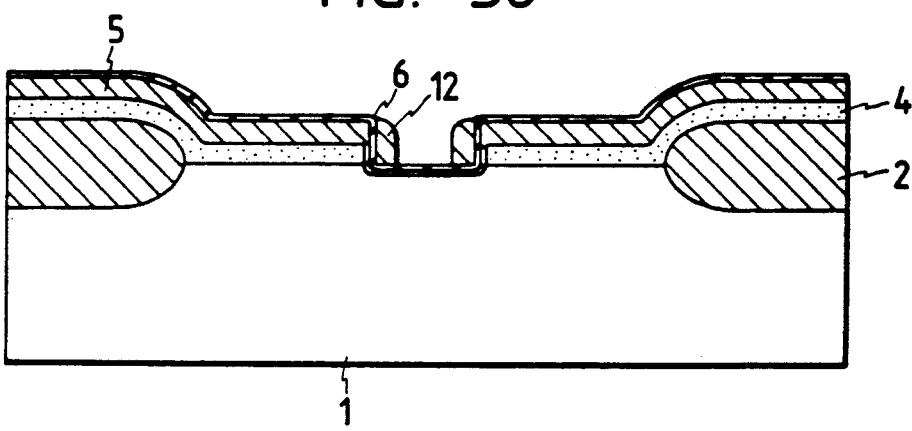
FIG. 56 shows a process step in fabricating the semiconductor device according to the fourth embodiment of this invention.
Figure 57:
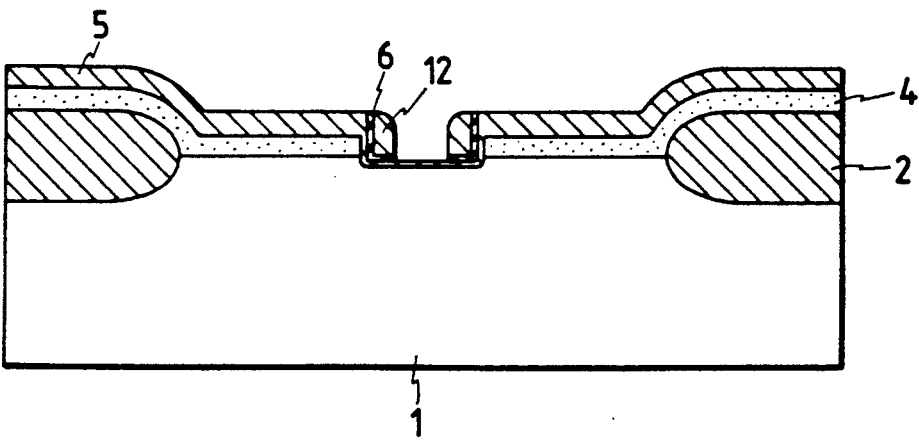
FIG. 57 shows a process step in fabricating the semiconductor device according to the fourth embodiment of this invention.
Figure 58:
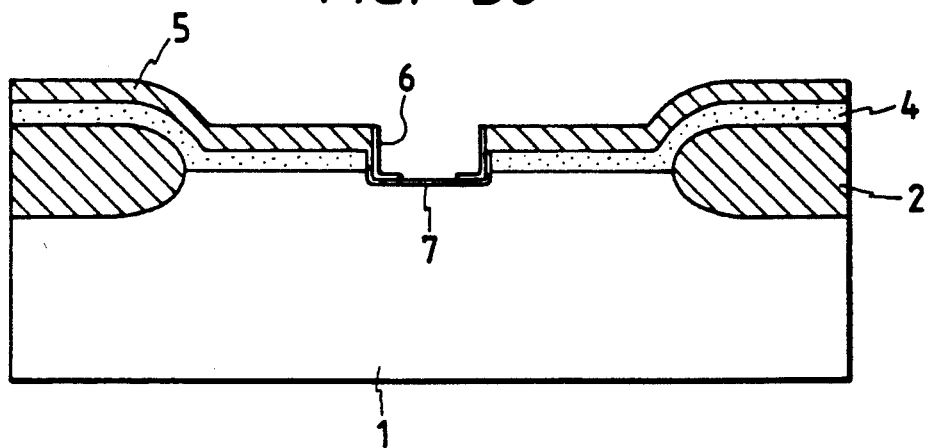
FIG. 58 shows a process step in fabricating the semiconductor device according to the fourth embodiment of this invention.
Figure 59:
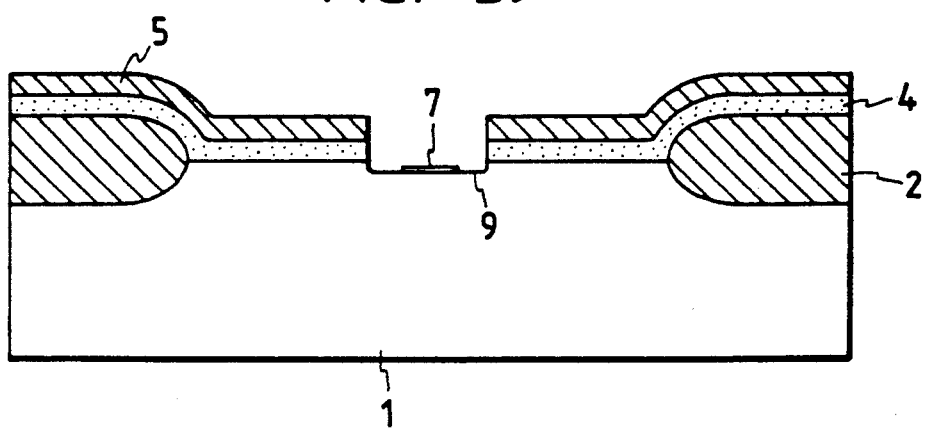
FIG. 59 shows a process step in fabricating the semiconductor device according to the fourth embodiment of this invention.
Figure 60:
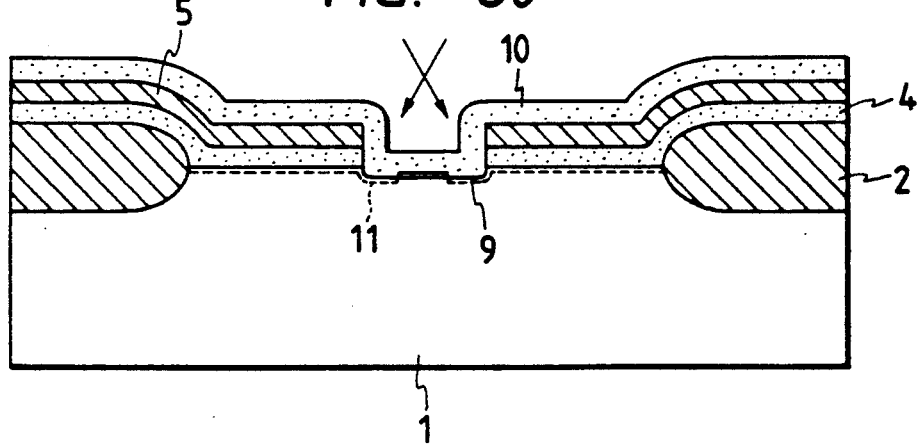
FIG. 60 shows a process step in fabricating the semiconductor device according to the fourth embodiment of this invention.
Figure 61:
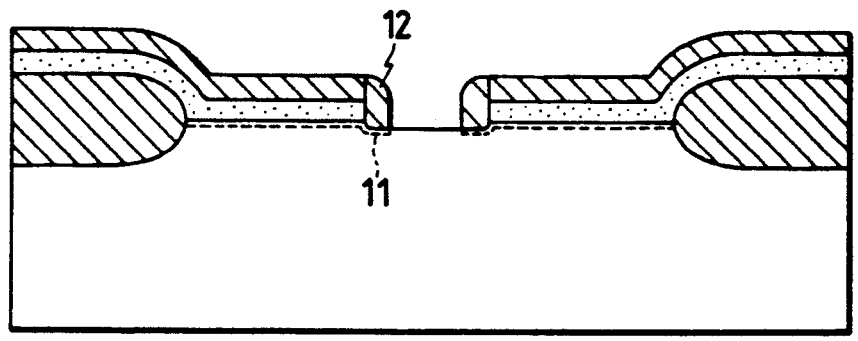
FIG. 61 shows a process step in fabricating the semiconductor device according to the fourth embodiment of this invention.
Figure 62:
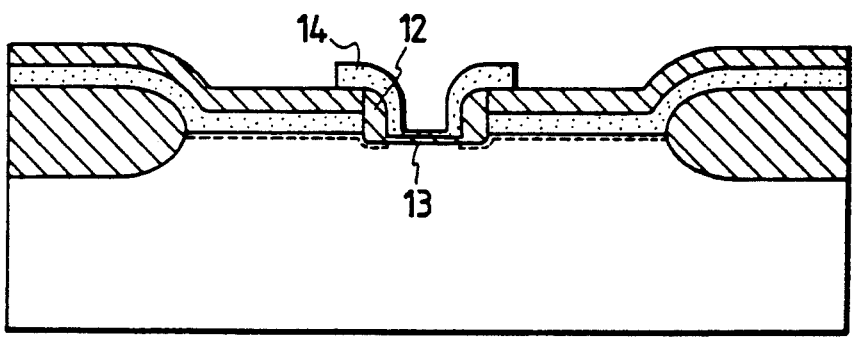
FIG. 62 shows a process step in fabricating the semiconductor device according to the fourth embodiment of this invention.
Figure 63:
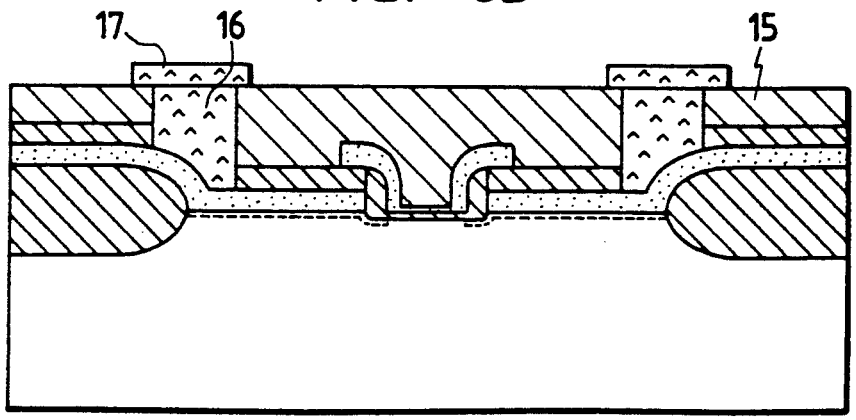
FIG. 63 shows a process step in fabricating the semiconductor device according to the fourth embodiment of this invention.

The fabrication process will be described with reference to FIG. 51 and succeeding figures. A field isolation oxide film 2 is formed on a substrate 1 (FIG. 51), and elevated source/drain 4, 5 is deposited (FIG. 52). The elevated source/drain 4, 5 is separated into a pair of islands (FIG. 53), and an oxide film 7 is formed on the surface (FIG. 54), in the same manner as in the above-described processes. The thickness of the oxide film 7 is about 3 nm. On the oxide film 7, a nitride film 6 is deposited in a thickness of about 20 nm (FIG. 55). Further, an oxide film 12 is deposited on the entire surface in a thickness of about 100 nm, and a known isotropic dry-etching is carried out, whereby the oxide film 12 is left only on the sidewall of the elevated source/drain as a sidewall oxide film 12, as shown in FIG. 56. With the sidewall oxide film 12 as a mask, the exposed nitride film 6 is removed selectively, as shown in FIG. 57. After removal of the sidewall oxide film 12, the substrate surface is oxidized using the remaining nitride film 6 as a mask (FIG. 58), whereby a thick oxide film is grown in the unmasked region. The thickness of the oxide film 7 thus grown was 20 nm. Here, the oxide film present beneath the nitride film 6 was about 3 nm thick. Subsequently, the substrate is placed into a heated phosphoric acid solution to selectively remove only the nitride film 6, resulting in the structure shown in FIG. 59. The oxide film beneath the nitride film, which has served as the mask for oxidation, is removed while leaving the selectively grown oxide film 7, whereby the substrate surface is exposed. Such processing is possible because there is a ten-fold difference in thickness between the selectively grown oxide film and the oxide film beneath the nitride film. As has been described above, a very thin oxide film 9 is then formed on the exposed substrate surface and the sidewall of the polysilicon film, and polysilicon 10 to serve as a diffusion source of impurities is deposited and turned to a desired conduction type (FIG. 60). A heat treatment is then applied to cause diffusion of the impurities from the polysilicon, to form junction 11. The steps shown in FIGS. 61 to 63 are the same as in the foregoing embodiments, and explanation of these steps is omitted here. According to the fourth embodiment, the polysilicon which serves as a diffusion source of impurities does not need processing. Therefore, even if an oxide film is grown on the surface of the polysilicon during the heat treatment, it is easy to remove the polysilicon by washing or the like. It is an important merit, for improvement of process margin, that the polysilicon to serve as the diffusion source does not need processing.

The processes as described hereinabove each have the drawback of an increased number of processing steps, as compared with the case of conventional-type semiconductor devices. A fabrication process which overcomes the drawback will be described with reference to the following embodiment.

Fifth embodiment

Figure 64:
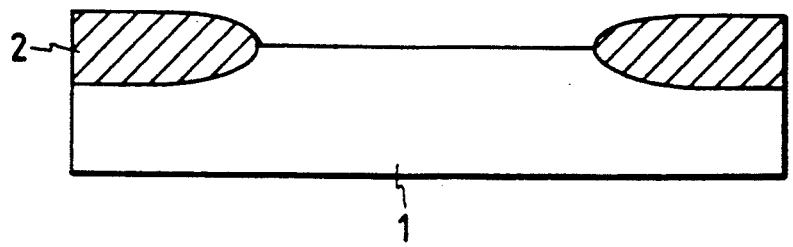
FIG. 64 shows a process step in fabricating the semiconductor device according to the fifth embodiment of this invention.
Figure 65:
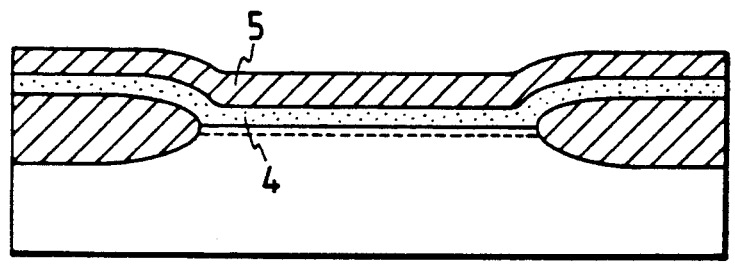
FIG. 65 shows a process step in fabricating the semiconductor device according to the fifth embodiment of this invention.
Figure 66:
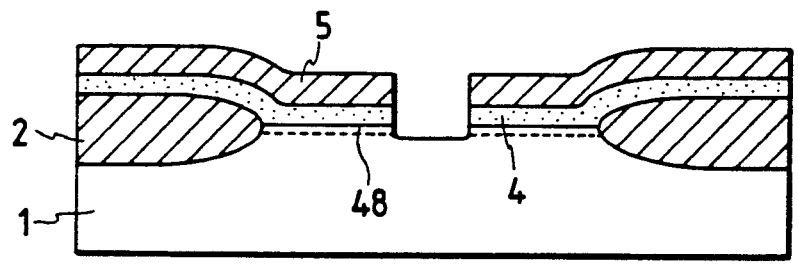
FIG. 66 shows a process step in fabricating the semiconductor device according to the fifth embodiment of this invention.
Figure 67:
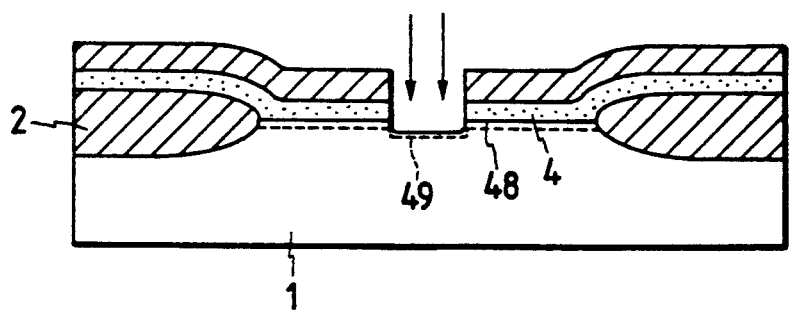
FIG. 67 shows a process step in fabricating the semiconductor device according to the fifth embodiment of this invention.
Figure 68:
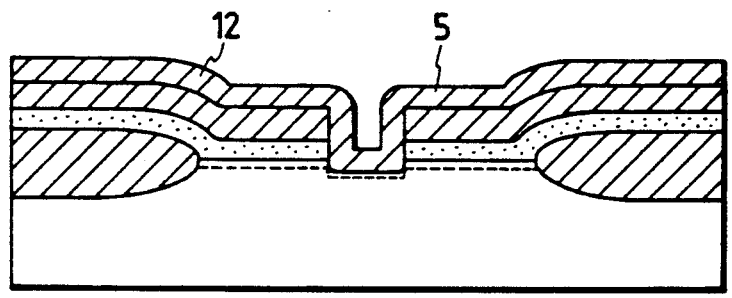
FIG. 68 shows a process step in fabricating the semiconductor device according to the fifth embodiment of this invention.
Figure 69:
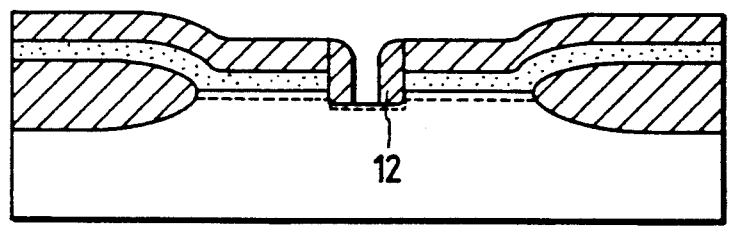
FIG. 69 shows a process step in fabricating the semiconductor device according to the fifth embodiment of this invention.
Figure 70:
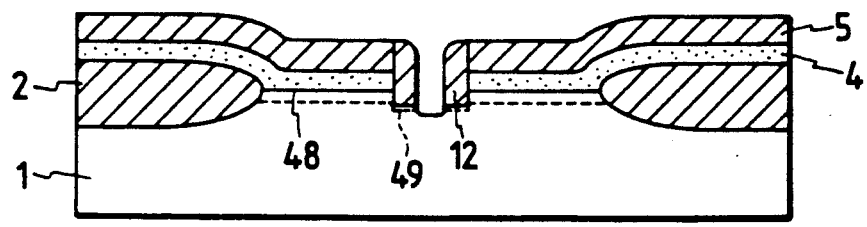
FIG. 70 shows a process step in fabricating the semiconductor device according to the fifth embodiment of this invention.
Figure 71:
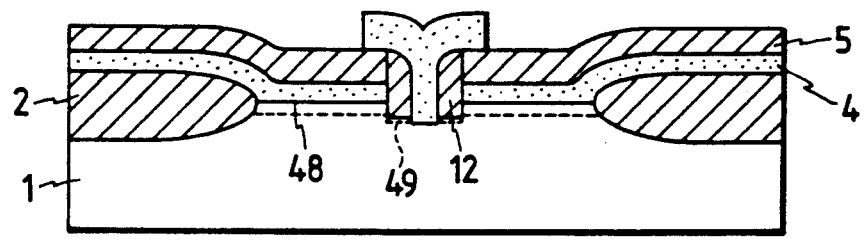
FIG. 71 shows a process step in fabricating the semiconductor device according to the fifth embodiment of this invention.
Figure 72:
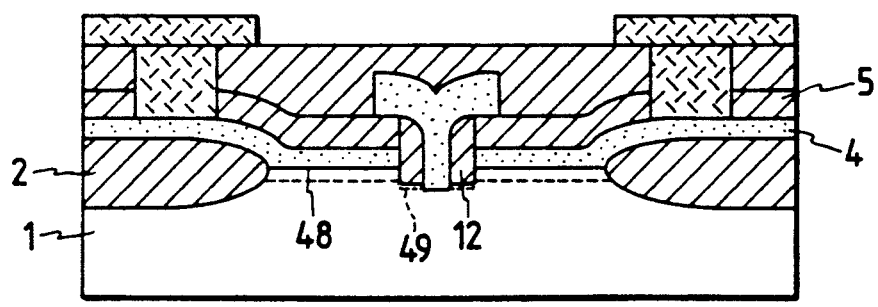
FIG. 72 shows a process step in fabricating the semiconductor device according to the fifth embodiment of this invention.

First, as in the foregoing embodiments, field isolation oxide 2 for electrical isolation of elements on semiconductor substrate is grown on a semiconductor substrate 1 of a first conduction type, as shown in FIG. 64. The growing method for the field isolation oxide and the film thickness thereof are the same as in the foregoing embodiments. Next, the surface of the semiconductor substrate is exposed, on which a conductor film 4 of a different condition type from the substrate is deposited, as shown in FIG. 65. In this embodiment, the technique of depositing the polysilicon and introducing impurities into the polysilicon by ion implantation is adopted, as in the foregoing embodiments. Where the substrate was p-type, from $2 \times 10^{15}/cm^2$ to $1'10^{16}/cm^2$ of phosphorus was implanted into polysilicon; where the substrate was n-type, the same amount of boron was implanted into polysilicon. The film thickness of the polysilicon was from 100 to 200 nm. An oxide film 5 is then deposited in a thickness of about 200 nm by the known CVD. The deposition is carried out at a temperature of about 750° C., so that the impurities in the polysilicon are diffused into the substrate (as indicated by 48) during the deposition. Next, etching is carried out using a mask of desired shape so that a composite film consisting of the conductor film 4 and the oxide film 5, which will form elevated junctions, is separated into a pair of junctions as shown in FIG. 66. For this purpose, a photo-resist mask is first formed, and the oxide film 5 is separated by use of the mask. Then, the photo-resist film is removed, and the polysilicon 4 is separated into two islands by using the oxide film 5 as a mask. In this case, the surface of the semiconductor substrate 1, which is made of the same material as the polysilicon 4, is also etched to some extent. In this embodiment, an about 60 nm substrate etch was observed. Subsequently, impurities 49 for forming part of junctions are introduced by ion implantation into the semiconductor substrate between the pair of elevated junctions, as shown in FIG. 67. For avoiding contamination at the time of ion implantation, the ion implantation is preceded by substrate surface oxidation, the explanation of which is omitted here. Where the substrate was p-type, arsenic was implanted in an amount of $1 \times 10^{13}/cm^2$ to $2 \times 10^{15}/cm^2$; where the substrate was n-type, the same amount of boron was implanted in the form of $BF_2$. In both cases, the implanting energy was controlled so that the depth of the junction 49 was 0.1 μm or below. After contamination attendant on the ion implantation is removed, an oxide film 12 is deposited in a thickness of about 100 nm, as shown in FIG. 68. The thickness of the oxide film 12 can be varied, according to the gate length desired. Anisotropic etching is applied to the oxide film 12, to leave the oxide film 12 only on the sidewalls of the elevated junctions 4 and 5, as shown in FIG. 69. Consequently, the elevated junction is insulated and separated self-alignedly. Next, using the sidewall oxide film 12 and the oxide film 5 on elevated junction as a mask, the substrate containing the impurity-doped layer 49 which will be part of junctions is etched down, as shown in FIG. 70. The etch depth is from 50 to 100 nm. Further, as shown in FIG. 71, impurities of the same conduction type as the substrate are ion-implanted through the space between the adjacent sidewall oxide films 12, to form a punch-through stopper layer (which is not shown in this sectional view). The following steps shown in FIGS. 71 and 72 are the same as in the foregoing embodiments, and explanation thereof is omitted here.

Figure 73:
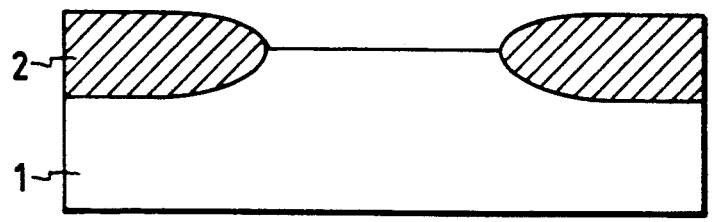
FIG. 73 shows a process step in fabricating the semiconductor device according to the fifth embodiment of this invention.
Figure 74:
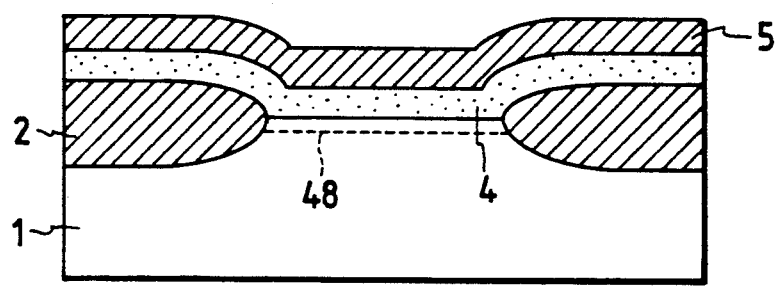
FIG. 74 shows a process step in fabricating the semiconductor device according to the fifth embodiment of this invention.
Figure 75:
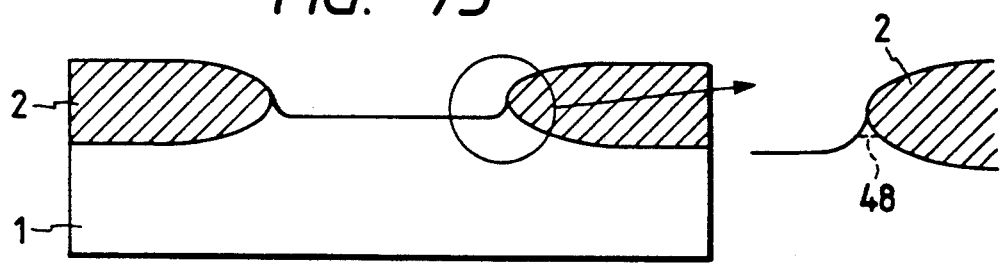
FIG. 75 shows a process step in fabricating the semiconductor device according to the fifth embodiment of this invention.
Figure 76:
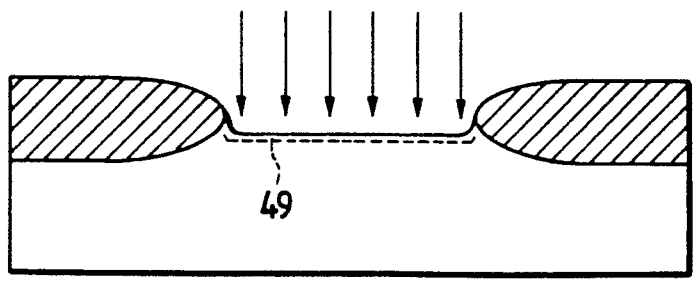
FIG. 76 shows a process step in fabricating the semiconductor device according to the fifth embodiment of this invention.
Figure 77:
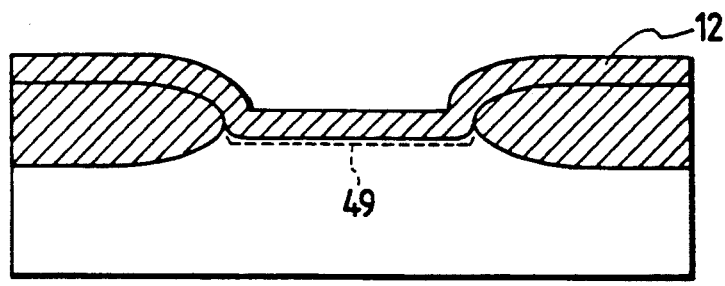
FIG. 77 shows a process step in fabricating the semiconductor device according to the fifth embodiment of this invention.
Figure 78:
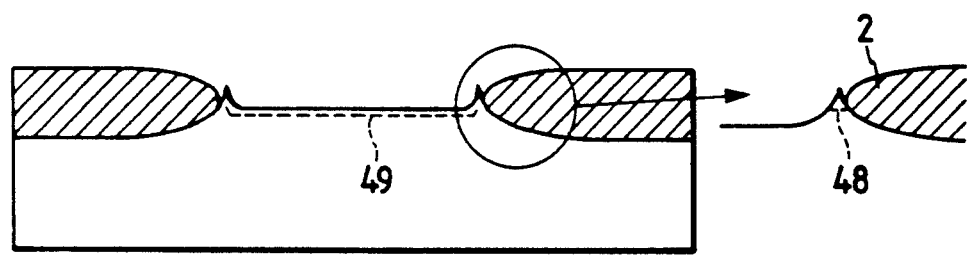
FIG. 78 shows a process step in fabricating the semiconductor device according to the fifth embodiment of this invention.
Figure 79:
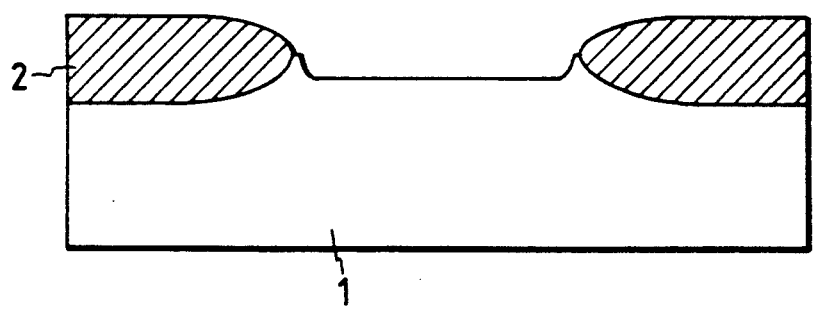
FIG. 79 shows a process step in fabricating the semiconductor device according to the fifth embodiment of this invention.

In this embodiment, the procedure is used in which the impurity-doped layer 49 for constituting part of the junctions is preliminarily formed in a channel-forming region and is thereafter removed. Therefore, incomplete removal of the impurities from the channel region will cause electrical connection between the junctions. In particular, the wedge-shaped growth of oxide film at each edge of the field isolation oxide 2 (the wedge-shaped edge portion is called "bird's beak") causes the problem that the impurities having gotten under the bird's beak cannot be removed. This situation will be explained with reference to device cross-section in parallel to the gate electrode, as shown in FIG. 73 and subsequent figures. First, the field isolation oxide 2 is grown as shown in FIG. 73. Next, the composite film consisting of conductor 4 (polysilicon) and oxide 5, which will constitute the elevated junction, is deposited (FIG. 74). In this step, the impurities in the polysilicon are diffused into the substrate (as indicated by 48) and gets into the region beneath the field isolation oxide, as has been mentioned above. Upon the subsequent processing of the elevated junction into the desired shape, as shown in FIG. 75, both the elevated junction and the oxide film thereon in this section are removed and, further, the semiconductor substrate I is etched. At this point, the impurity-doped layer 48 beneath the bird's beak of the field isolation oxide 2 remains unremoved. Then, impurities 49 for forming part of the junctions are ion-implanted, as shown in FIG. 76. In this section, the impurities 49 are implanted over the entire substrate surface, as shown. Thereafter, the oxide film 12 which will form the sidewall oxide film on the elevated junction is deposited, as shown in FIG. 77. Here, anisotropic dry-etching is carried out to leave the oxide only on the sidewall of the elevated junction, as has been shown in FIG. 69. By the dry-etching, the field isolation oxide 2 is also etched away to some extent, with an attendant recession of the bird's beak, as shown in FIG. 78. As a result, the impurity-doped region 48 having extended under the bird's beak is exposed. As has been described above, the depth of the junction formed by ion implantation into the substrate is 0.1 μm or below, and the lateral extent of the impurities getting into the region beneath the bird's beak is around 0.05 μm. Taking these into account, the anisotropic dry-etching in this embodiment was so controlled as to cause an about 0.1 μm recession of the edge of field isolation oxide 2. Such a recession as this has no influence on field isolation performance. Then, the substrate is partly etched away as shown in FIG. 70, whereby the impurities 48 present under the bird's beak are removed, as shown in FIG. 79. Finally, formation of gate oxide film and gate electrode, deposition of interlayer oxide film, opening of contact holes, and formation of wiring are carried out to complete the semiconductor device according to this invention. Explanation of these processing steps is omitted here, because the shapes of the elements processed are not clear in the device section under consideration.

Because a known oxidation method for field isolation is used in this embodiment, there is the problem of lateral diffusion of impurities into the region beneath the bird's beak. It will be readily understood that the problem is solved by use of a field isolation oxidation method in which the bird's beak phenomenon is slight, or by use of trench isolation which is free of the bird's beak phenomenon.

One of the major features of the semiconductor device and process for fabrication thereof according to this invention is that MOSFETs of the elevated source/drain structure according to the invention and MOSFETs of other structure according to the prior art can be formed together on the same substrate, without dimensional limitations. With particular reference to this feature, a sixth embodiment below will illustrate the fabrication process for semiconductor device according to this invention.

Sixth embodiment

Figure 80:
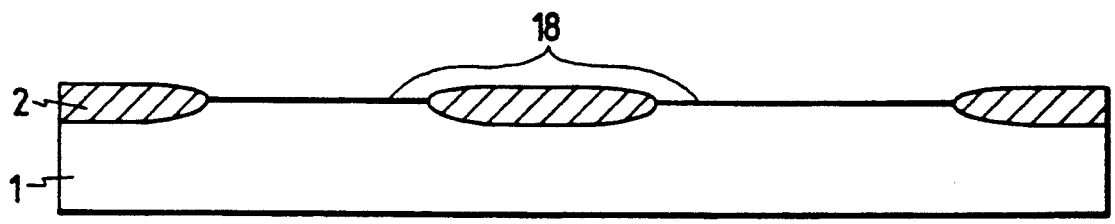
FIG. 80 shows a process step in fabricating the semiconductor device according to the sixth embodiment of this invention.
Figure 81:
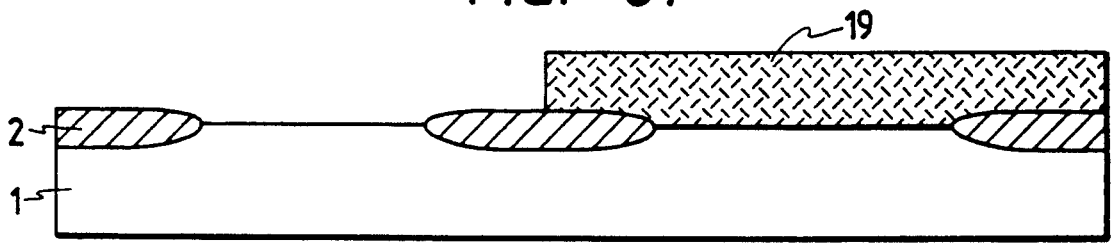
FIG. 81 shows a process step in fabricating the semiconductor device according to the sixth embodiment of this invention.
Figure 82:
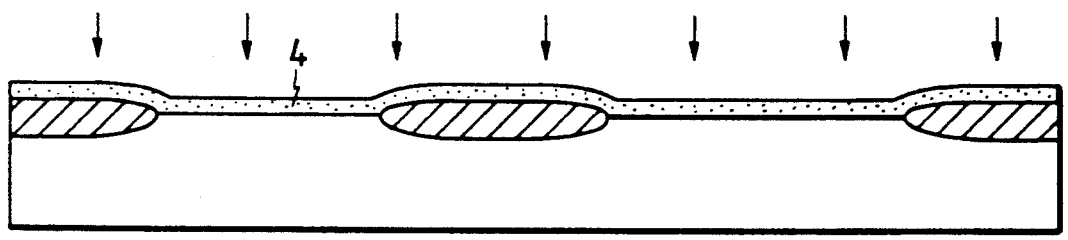
FIG. 82 shows a process step in fabricating the semiconductor device according to the sixth embodiment of this invention.
Figure 83:
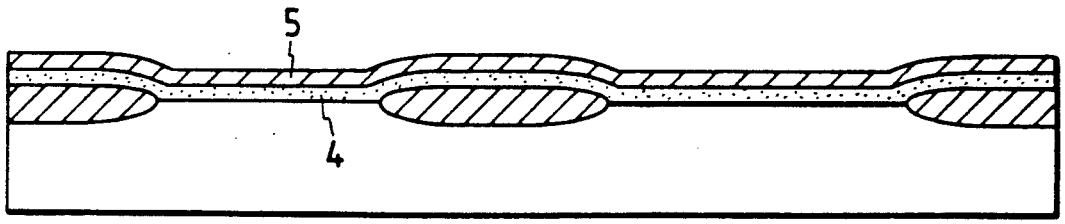
FIG. 83 shows a process step in fabricating the semiconductor device according to the sixth embodiment of this invention.

As in the foregoing embodiments, field isolation oxide 2 is grown on a semiconductor substrate 1, and the substrate surface is left covered with an oxide film 18 (FIG. 80). Next, the oxide film 18 is removed only from the substrate surface located in the region for fabricating an FET of the elevated source/drain structure, by covering the other region with a photo-resist mask 19, as shown in FIG. 81. After the photo-resist is removed and the substrate surface cleaned, a polysilicon film 4 for forming elevated source/drain is deposited (FIG. 82). In the region for fabricating an FET of the conventional structure, the oxide film remains on the substrate and, therefore, the polysilicon film is not in contact with the substrate. Desired impurities are introduced into the polysilicon by ion implantation, as indicated by arrows in the figure. An oxide film 5 is then deposited on the polysilicon 4, as shown in FIG. 83.

Figure 84:
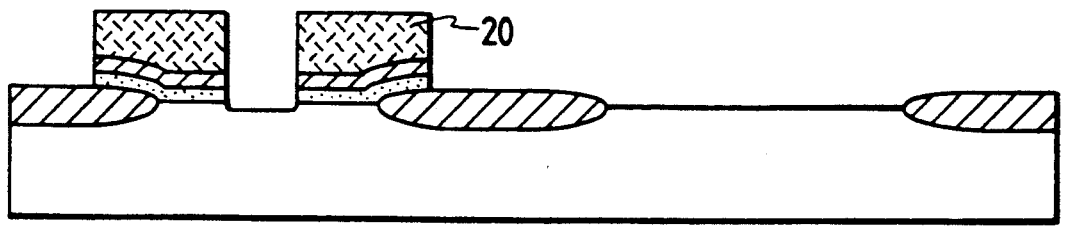
FIG. 84 shows a process step in fabricating the semiconductor device according to the sixth embodiment of this invention.
Figure 85:
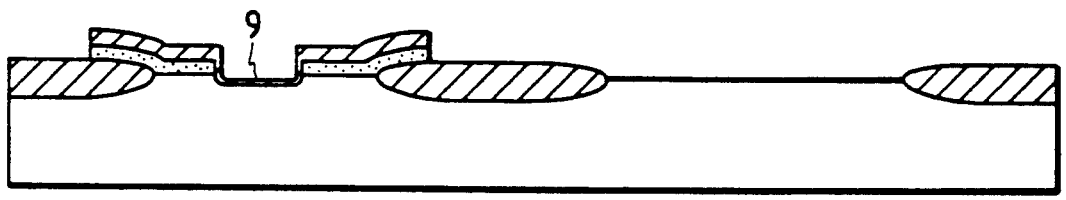
FIG. 85 shows a process step in fabricating the semiconductor device according to the sixth embodiment of this invention.
Figure 86:
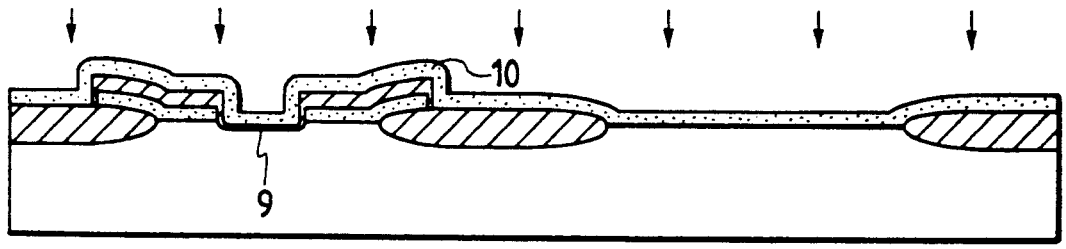
FIG. 86 shows a process step in fabricating the semiconductor device according to the sixth embodiment of this invention.

Subsequently, the composite film for forming the elevated source/drain is processed by use of a photoresist mask 20, as shown in FIG. 84. During the processing, the region for forming the FET of the conventional structure remains covered by the oxide film thereon. Impurity diffusion from silicon film is then carried out. As has been described hereinabove, a thin oxide film 9 is first grown chemically on the exposed surface of silicon substrate (FIG. 85). A silicon film 10 to become a diffusion source of impurities is deposited on the thin oxide film 9, and impurities of the desired conduction type are introduced into the silicon film 10 (FIG. 86) by ion implantation, as indicated by arrows. The procedure shown here is the same as described above in the second embodiment, but the corresponding procedures explained respectively in the third, fourth and fifth embodiments may also be used.

Figure 87:
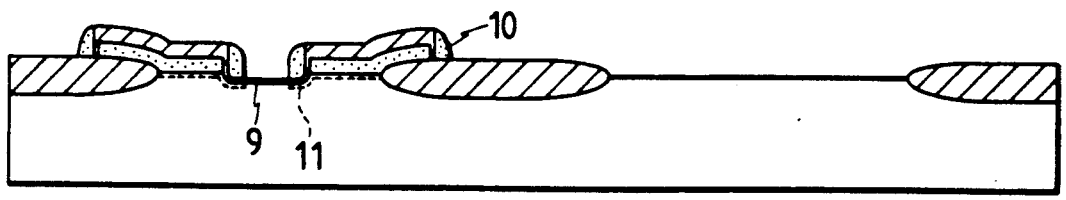
FIG. 87 shows a process step in fabricating the semiconductor device according to the sixth embodiment of this invention.
Figure 88:
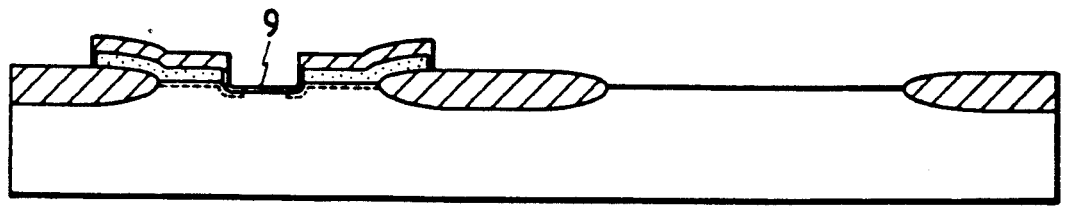
FIG. 88 shows a process step in fabricating the semiconductor device according to the sixth embodiment of this invention.
Figure 89:
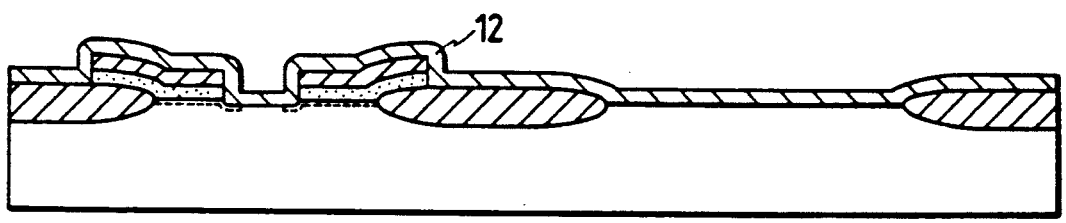
FIG. 89 shows a process step in fabricating the semiconductor device according to the sixth embodiment of this invention.
Figure 90:
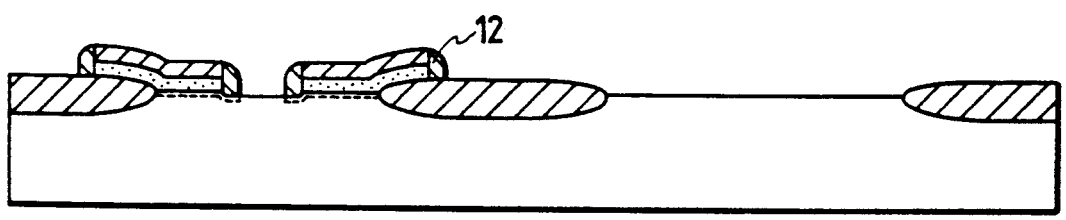
FIG. 90 shows a process step in fabricating the semiconductor device according to the sixth embodiment of this invention.
Figure 91:
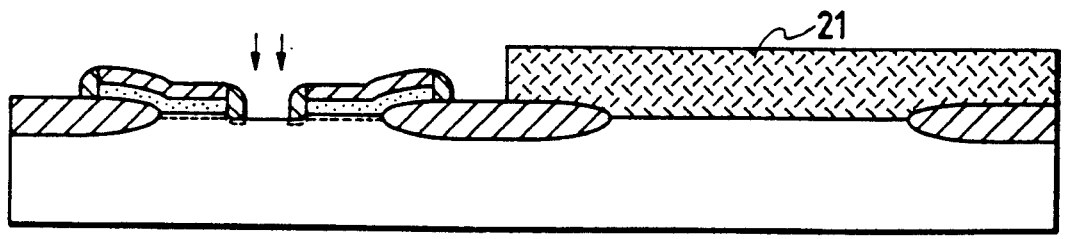
FIG. 91 shows a process step in fabricating the semiconductor device according to the sixth embodiment of this invention.

Then, as has been described above, the polysilicon film 10 is left on the sidewalls, and the impurities are diffused therefrom through the oxide film 9 below, to form junctions Il (FIG. 87). The diffusion source silicon film is removed completely, as shown in FIG. 88. An oxide film 12 is then deposited, as shown in FIG. 89, and is processed to insulate the silicon film in the elevated source/drain region, as shown in FIG. 90. The region for forming the conventional-structure FET is protected with a photo-resist mask, and ion implantation for controlling the FET punch-through is carried out through the space between the adjacent elevated source/drain regions (FIG. 91). In an actual integrated circuit, the elevated FET structure is used for FETs with small-sized gate, and the conventional structure for FETs with large gate length. For this purpose, the substrate concentration should be optimized for respective types of FETs. However, where it is preliminarily decided to use the conventional structure for only those FETs having a gate length over a certain value, it is possible to at least discriminate between the substrate concentration for the conventional type FETs and the substrate concentration for the elevated type FETs.

Figure 92:
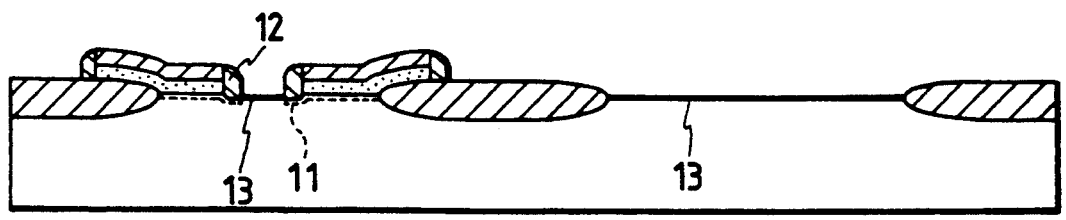
FIG. 92 shows a process step in fabricating the semiconductor device according to the sixth embodiment of this invention.
Figure 93:
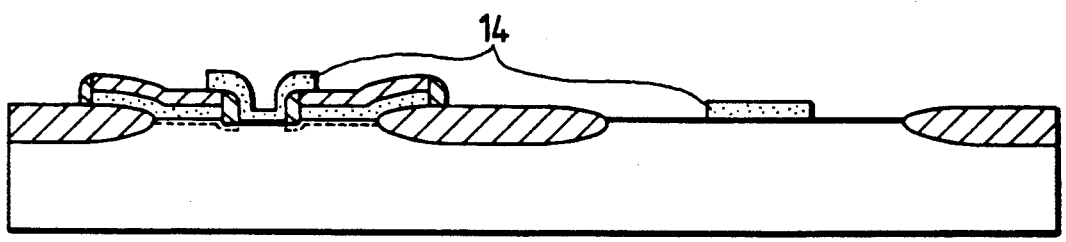
FIG. 93 shows a process step in fabricating the semiconductor device according to the sixth embodiment of this invention.
Figure 94:
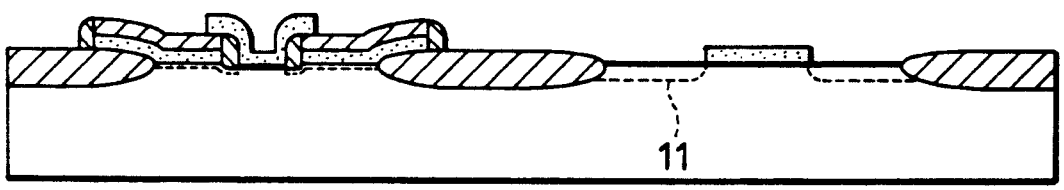
FIG. 94 shows a process step in fabricating the semiconductor device according to the sixth embodiment of this invention.
Figure 95:
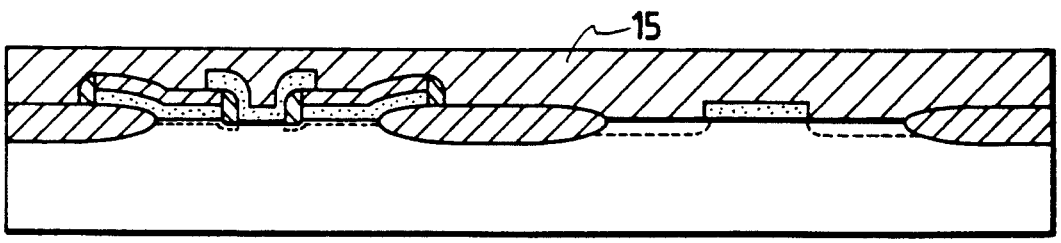
FIG. 95 shows a process step in fabricating the semiconductor device according to the sixth embodiment of this invention.
Figure 96:
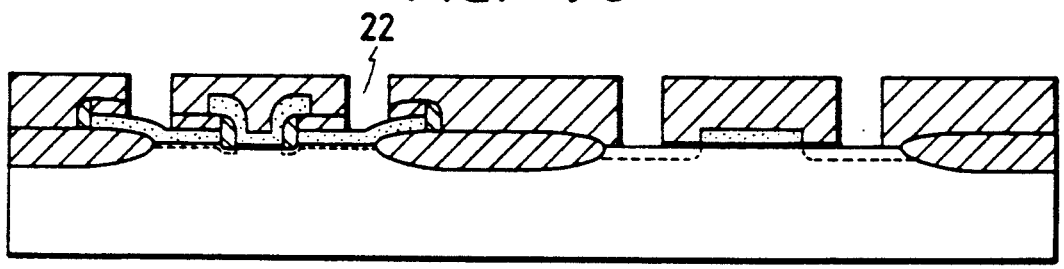
FIG. 96 shows a process step in fabricating the semiconductor device according to the sixth embodiment of this invention.
Figure 97:
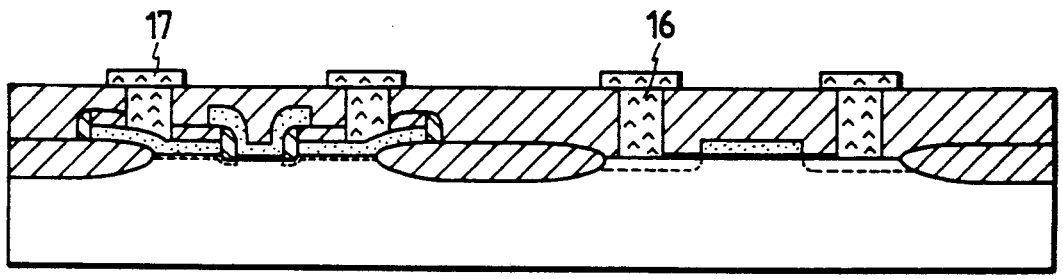
FIG. 97 shows a process step in fabricating the semiconductor device according to the sixth embodiment of this invention.

After such optimization of substrate concentration and cleaning of the surface, a gate oxide film 13 is grown (FIG. 92). As shown in the figure, the gate oxide film is common to both types of FETs. Further, gate electrodes are formed using the same polysilicon 14 (FIG. 93). Next, the elevated structure region is covered with a photo-resist mask, and ion implantation is applied to the conventional-structure FET region to form junctions Il (FIG. 94). Finally, wiring is formed, as shown in FIGS. 95 to 97, to complete a semiconductor device which contains the different types of FETs.

Figure 98:
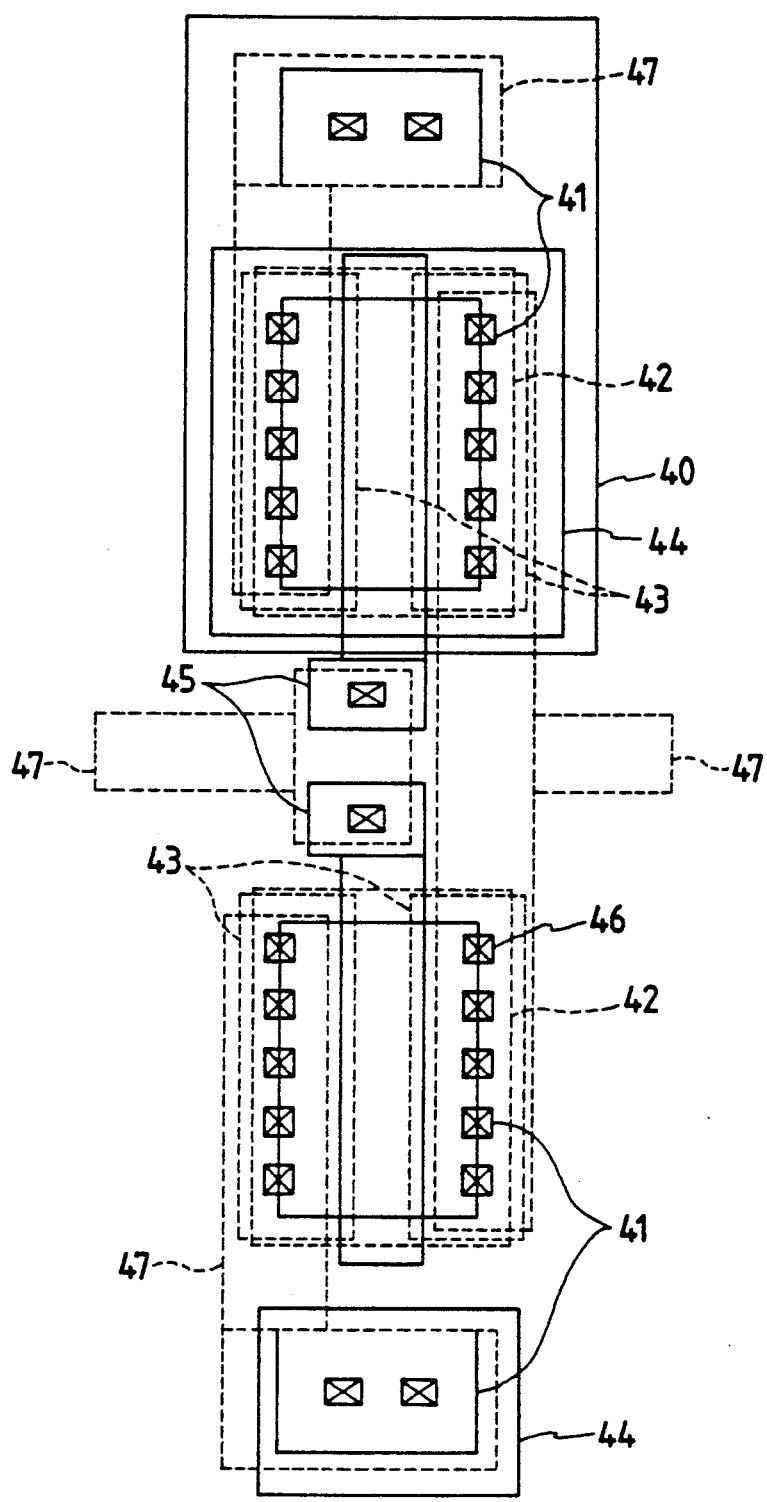
FIG. 98 illustrates a CMOS type inverter using the semiconductor device according to this invention.

Thus far, the structure of the semiconductor device and the process for fabrication thereof according to this invention have been described with reference to the embodiments, placing major emphasis on the sectional structure. On the other hand, FIG. 98 shows a plan view of a semiconductor device according to this invention, particularly, a CMOS inverter which is fundamental to all circuits. The elevated type FET is characterized in that part of the junction protrudes over the field isolation oxide. As a result, the area of active region, namely, the total area of junctions and channel region in the elevated type FET is larger than that in the conventional type FET. In addition, as is clearly seen from the sectional view of the elevated type FET, the gate electrode also protrudes over the elevated source/drain region, with the result of a corresponding increase in the distance between contact and gate edge, as compared to the conventional FET. This also contributes to increased plan-view area of the elevated type FET. However, the increase in area is less than 10%, on comparison according to the same design rule.

A plan view prepared taking these points into account is given in FIG. 98, which shows a CMOS inverter. First, a region 40 in which to define the conduction type of substrate is drawn. The conduction type of the semiconductor substrate bounded within the region is different from the conduction type in the outside region. Specifically, the inside region is n-type, for forming a p-channel FET. Further, regions 41 in which to define the field isolation oxide is drawn. Then, a pattern 43 for the elevated source/drain regions is superimposed. This pattern consists of a pair of islands, and a channel region is formed in the substrate exposed between the two islands. Further, a pattern 44 for distributed implantation of impurities into the elevated source/drain regions is required. A gate electrode pattern 45 is placed to as to protrude over the elevated source/drain regions. Contacts 46 are formed on the gate electrode, elevated source/drain regions, and substrate, and are interconnected by wiring 47. Here, the minimum processing size was set at 0.3 μm, corresponding to 64-megabit DRAM, and the contacts were made in the minimum size. The gate length is also 0.3 μm, but the spacing between the adjacent elevated/source drain regions is 0.5 μm, because the sidewalls of these regions are covered with an oxide film which is 0.1 μm thick. In addition, the gate electrode protruding over the elevated source/drain regions is naturally larger than 0.3 μm. Thus, the processing at the minimum size is required only for the contacts.

As has been described with reference to some embodiments above, it is possible, by the semiconductor device and the fabrication process according to this invention, to realize an elevated source/drain FET which has a small junction area and a controlled distribution of impurities at source/drain edges. The semiconductor device enables control of the impurity distribution at source/drain edges, which has been the greatest problem in the conventional FET structures, while maintaining all the advantages possessed by the conventional elevated structures, such as (1) self-aligned determination of gate length, and (2) prevention of increases injunction resistance and junction capacitance. Consequently, very shallow junction is achieved at source/drain edges, and short channel performance of FET is further improved.

What is claimed is:

1. A process for fabricating an MOS type field effect transistor comprising:
   a step of forming a first insulator film on a semiconductor substrate, and then a first conductor layer on said first insulator film;
   a step of forming an opening in said first conductor layer and said first insulator film, and forming a second conductor layer on the sidewall of said opening, said second conductor layer containing impurities of a predetermined conduction type;
   a step of forming a second insulator film to cover therewith both said second conductor layer on said sidewall of said opening and the substrate surface at said opening;
   a step of forming a third conductor layer on the sidewall of said second insulator film at said opening, said third conductor layer containing impurities of said predetermined conduction type;
   a step of diffusing the impurities of said predetermined conduction type from said second conductor layer and said third conductor layer into said semiconductor substrate so as to form a source region and a drain region of the MOS transistor;
   a step of removing said third conductor layer and said second insulator film after formation of said source and drain regions, and forming a third insulator film on the sidewall of said second conductor layer thus exposed; and
   a step of forming a fourth insulator film as a gate insulator film on the semiconductor substrate surface in an area bounded by said third insulator film.

2. The process according to claim 1, wherein the thickness of said second insulator film is about 10 to 20 Å.

3. The process according to claim 1, wherein said second insulator film is formed by oxidation of said second conductor layer and the substrate surface at said opening.

4. The process according to claim 1, wherein said second conductor film is formed on the lower side of a fourth insulator film provided with an opening smaller than said opening formed in said first insulator film.

5. The process according to claim 1, wherein said second conductor film comprises polysilicon.

6. The process according to claim 1, wherein said fist insulator film comprises a silicon nitride film.

* * * * *